(12) United States Patent
Horii et al.

(10) Patent No.: US 8,415,237 B2
(45) Date of Patent: *Apr. 9, 2013

(54) METHOD OF MANUFACTURING SEMICONDUCTOR DEVICE AND SUBSTRATE PROCESSING APPARATUS

(75) Inventors: Sadayoshi Horii, Toyama (JP); Yoshinori Imai, Nanto (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/213,567

(22) Filed: Aug. 19, 2011

(65) Prior Publication Data

US 2011/0300695 A1 Dec. 8, 2011

Related U.S. Application Data

(63) Continuation of application No. 12/230,396, filed on Aug. 28, 2008, now Pat. No. 8,026,159.

(30) Foreign Application Priority Data

Aug. 30, 2007 (JP) .................................. 2007-224654
Feb. 8, 2008 (JP) .................................. 2008-029272
Jul. 1, 2008 (JP) .................................. 2008-171947

(51) Int. Cl.
*H01L 21/00* (2006.01)
*C23C 16/00* (2006.01)

(52) U.S. Cl.
USPC .................................. 438/500; 118/723 VE

(58) Field of Classification Search .................... 438/500
See application file for complete search history.

(56) References Cited

U.S. PATENT DOCUMENTS 7,514,119 B2    4/2009  Ma et al.

FOREIGN PATENT DOCUMENTS

| JP | A-10-195659 | 7/1998 |
| JP | A-2000-192243 | 7/2000 |
| JP | A-2001-284336 | 10/2001 |
| JP | A-2003-273030 | 9/2003 |
| JP | A-2006-100737 | 4/2006 |
| JP | A-2007-036265 | 2/2007 |

OTHER PUBLICATIONS

Aug. 23, 2010 Office Action issued in U.S. Appl. No. 12/230,396.

*Primary Examiner* — William D Coleman
(74) *Attorney, Agent, or Firm* — Oliff & Berridge, PLC

(57) ABSTRACT

A method of manufacturing a semiconductor device includes the steps of loading a substrate into a processing chamber; processing the substrate by supplying plural kinds of reaction substances into the processing chamber multiple number of times; and unloading the processed substrate from the processing chamber, wherein at least one of the plural kinds of reaction substances contains a source gas obtained by vaporizing a liquid source by a vaporizing part; in the step of processing the substrate, vaporizing operation of supplying the liquid source to the vaporizing part and vaporizing the liquid source is intermittently performed, and at least at a time other than performing the vaporizing operation of the liquid source, a solvent capable of dissolving the liquid source is flowed to the vaporizing part at a first flow rate; and at a time other than performing the vaporizing operation of the liquid source and every time performing the vaporizing operation of the liquid source prescribed number of times, the solvent is flowed to the vaporizing part at a second flow rate larger than the first flow rate.

14 Claims, 12 Drawing Sheets

FIG 7
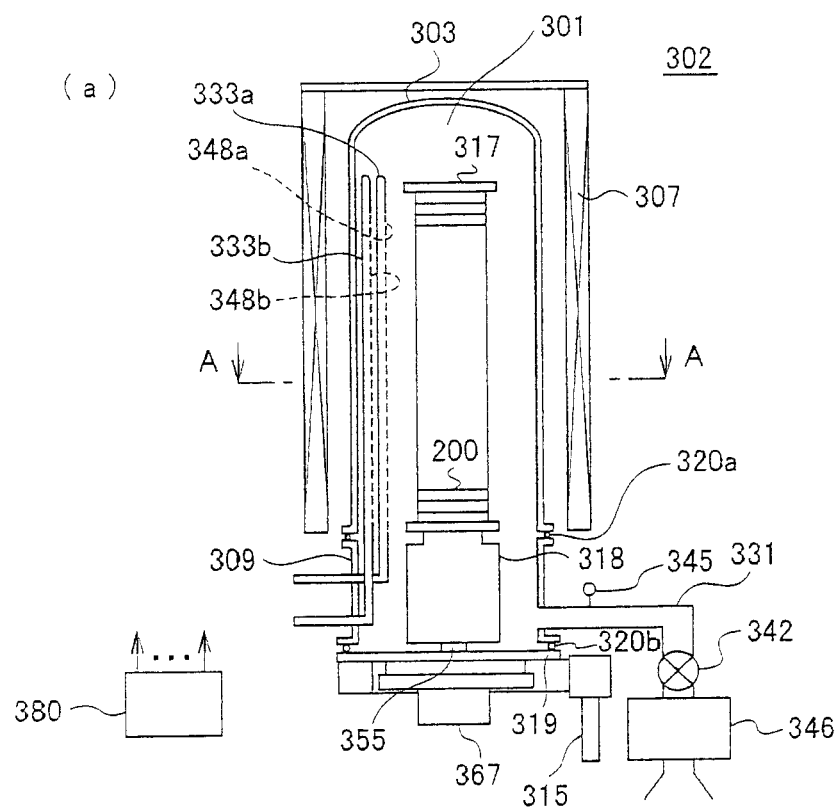
(a)
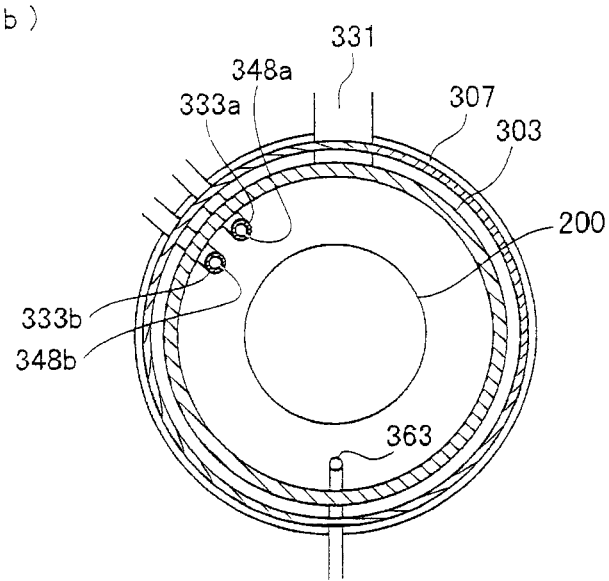
(b)

METHOD OF MANUFACTURING SEMICONDUCTOR DEVICE AND SUBSTRATE PROCESSING APPARATUS

This is a Continuation of application Ser. No. 12/230,396 filed Aug. 28, 2008. The disclosure of the prior application is hereby incorporated by reference herein in its entirety.

BACKGROUND

1. Technical Field

The present invention relates to a method of manufacturing a semiconductor device for processing a substrate by a source gas obtained by vaporizing liquid source, and a substrate processing apparatus.

2. Description of Related Art

As a method of forming a thin film by atomic layer unit on a substrate such as a wafer, a so-called ALD (Atomic Layer Deposition) is used. In the ALD method, for example, (1) the step of supplying a first processing gas into a processing chamber in which the substrate is contained and making the first processing gas adsorbed on the surface of the substrate, (2) the step of introducing inert gas into the processing chamber to remove the first processing gas remained in the processing chamber and purging an inside of the processing chamber, (3) the step of supplying a second processing gas into the processing chamber and causing reaction to occur between the second processing gas and the first processing gas adsorbed on the surface of the substrate, and (4) the step of introducing the inert gas into the processing chamber for removing the remained second processing gas in the processing chamber and a reaction by-product and purging the inside of the processing chamber, are set as one cycle, and this cycle is repeated.

Here, as the aforementioned first processing gas, for example, gas obtained by vaporizing a liquid source, being in a liquid state at a normal temperature, is used in some cases. Then, as an apparatus for vaporizing the liquid source, a vaporizer is used in some cases. The vaporizer has a vaporizing chamber for vaporizing the liquid source and generating gas; a liquid source flow passage, being a flow passage for discharging the liquid source into this vaporizing chamber; and a supply port for supplying the source gas generated in the vaporizing chamber to outside.

Note that an open/close valve that controls supply of the liquid source is provided on the flow passage of the liquid source. Then, in the aforementioned step (1), by opening the open/close valve provided on the flow passage of the liquid source, the supply of the liquid source to the vaporizing chamber is started. In addition, in the step other than the step (1), the supply of the liquid source to the vaporizing chamber is stopped by closing the open/close valve, and in order to prevent the change in quality of the liquid source remained in the flow passage of the liquid source, thereby blocking the flow passage of the liquid source, the inert gas is supplied into the flow passage of the liquid source and the inside of the flow passage is purged.

Here, as the aforementioned liquid source, for example, an organic metal liquid source including elements such as Sr (strontium), Ba (barium), and La (lanthanum) is used in some cases. These organic metal liquid sources have low vapor pressure and high viscosity. Therefore, the aforementioned organic metal liquid source is diluted by, a solvent, for example, such as ECH (ethylcyclohexane) and THF (tetrahydrofuran) in many cases.

However, the aforementioned solvent has a higher vapor pressure than that of the organic metal liquid source functioning as a solute. Therefore, in the step other than the aforementioned step (1), when the inert gas is supplied into the liquid source flow passage and the inside of the flow passage is purged, only the solvent is previously turned into vapor, and only the organic metal liquid source remains in the flow passage of the liquid source in some cases. Then, since the organic metal liquid source has high viscosity, it is difficult to remove the organic metal liquid source, even if the inert gas is supplied into the flow passage of the liquid source and the inside of the flow passage is purged. Therefore, the inside of the flow passage of the liquid source is blocked by the liquid source in some cases.

SUMMARY OF THE INVENTION

An object of the present invention is to provide a method of manufacturing a semiconductor device and a substrate processing apparatus capable of accelerating removal of the organic metal liquid source from the inside of the flow passage of the liquid source in the vaporizer, and suppressing blockade the inside of the flow passage of the liquid source.

One aspect of the present invention provides a method of manufacturing a semiconductor device, including the steps of:

loading a substrate into a processing chamber;

processing the substrate by supplying a plurality of kinds of reaction substances into the processing chamber; and unloading the processed substrate from the inside of the processing chamber, wherein at least any one of the plurality of kinds of reaction substances contains source gas obtained by vaporizing a liquid source in a vaporizing part, in the step of processing the substrate, vaporizing operation of supplying the liquid source to the vaporizing part and vaporizing the liquid source is intermittently performed, solvent capable of dissolving the liquid source is flowed to the vaporizing part at a first flow rate at least at a time other than performing the vaporizing operation of the liquid source, and a solvent is flowed to the vaporizing part at a second flow rate larger than the first flow rate, at the time other than the vaporizing operation of the liquid source and every time the vaporizing operation of the liquid source is performed a prescribed number of times.

Another aspect of the present invention provides a substrate processing apparatus, including the steps of:

a processing chamber that processes a substrate;

a vaporizing part that vaporizes a liquid source;

a liquid source supply system that supplies the liquid source to the vaporizing part;

a source gas supply system that supplies into the processing chamber a source gas obtained by vaporizing the liquid source in the vaporizing part;

a reaction gas supply system that supplies into the processing chamber a reaction gas different from the source gas;

a solvent supply system that supplies to the vaporizing part a solvent capable of dissolving the liquid source; and a controller that controls the liquid source supply system, the vaporizing part, the source gas supply system, the solvent supply system, and the reaction gas supply system, so that supply of the source gas and supply of the reaction gas into the processing chamber are performed multiple number of times, and at that time, vaporizing operation of supplying the liquid source to the vaporizing part and vaporizing the liquid source is intermittently performed, and at least at a time other than performing the vaporizing operation of the liquid source, the solvent is flowed to the vaporizing part at a first flow rate, and at the time other than performing the vaporizing operation of the liquid source and every time performing the vaporizing operation of the liquid source prescribed number of times, the solvent is flowed to the vaporizing part at a second flow rate larger than the first flow rate.

According to the method of manufacturing the semiconductor device and the substrate processing apparatus of the present invention, it is possible to accelerate the removal of the organic metal liquid source from the inside of the flow passage of the liquid source in the vaporizer, and it is possible to suppress the blockage of the inside of the flow passage of the liquid source.

BRIEF DESCRIPTION OF THE DRAWINGS

FIG. 7 is a schematic block diagram of a vertical processing furnace of a vertical ALD apparatus according to a third embodiment of the present invention, wherein FIG. 7A shows a processing furnace part by a vertical sectional face, and FIG. 7B shows a sectional face of the processing furnace part taken along the line A-A.

FIG. 11A shows the timing of supplying the solvent when the solvent is not flowed in each vaporization cycle, and FIG. 11B shows the timing of supplying the solvent when the flow rate of the solvent in a vaporization cycle is set smaller than the flow rate of the solvent in a cleaning cycle.

FIG. 12A shows the timing of supplying the solvent when a large amount of flushing operation is executed every time the vaporization cycle is performed, and FIG. 12B shows the timing of supplying the solvent when further large amount of flushing operation is executed every time the vaporization cycle is performed prescribed number of times, while performing a small amount of flushing operation every time the vaporization cycle is performed.

DESCRIPTION OF PREFERRED EMBODIMENT OF THE INVENTION (First Embodiment)
(1) Structure of a Substrate Processing Apparatus First, a structure of a substrate processing apparatus according to this embodiment will be explained, with reference to FIGS. 3 and 4. FIG. 4 is a sectional block diagram in transferring a wafer of the substrate processing apparatus according to a first embodiment of the present invention, and FIG. 3 is a sectional block diagram in processing the wafer of the substrate processing apparatus according to the first embodiment of the present invention.

<Processing Chamber>

Figure 3:
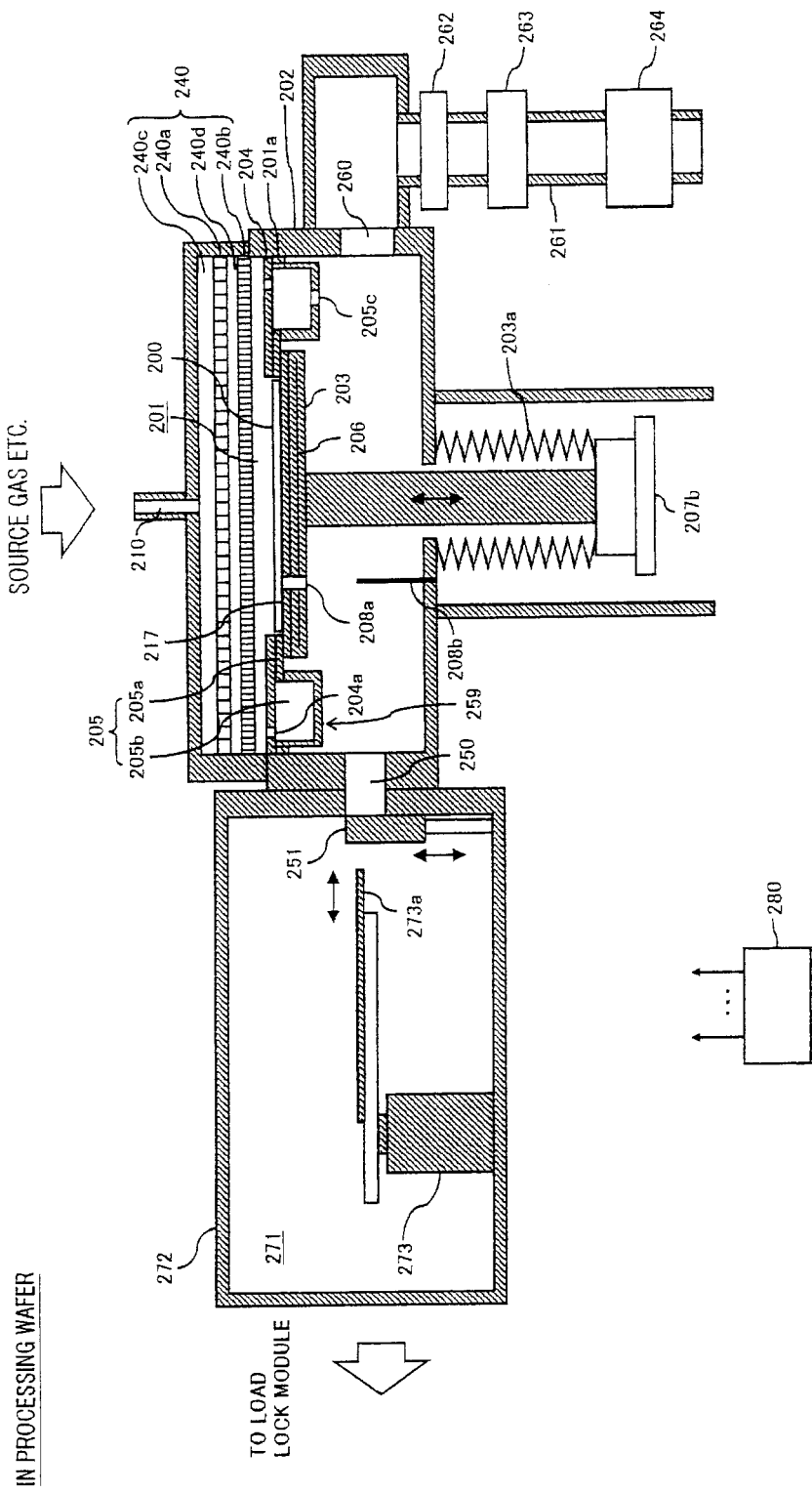
FIG. 3 is a sectional block diagram in wafer processing of the substrate processing apparatus according to the first embodiment of the present invention.
Figure 4:
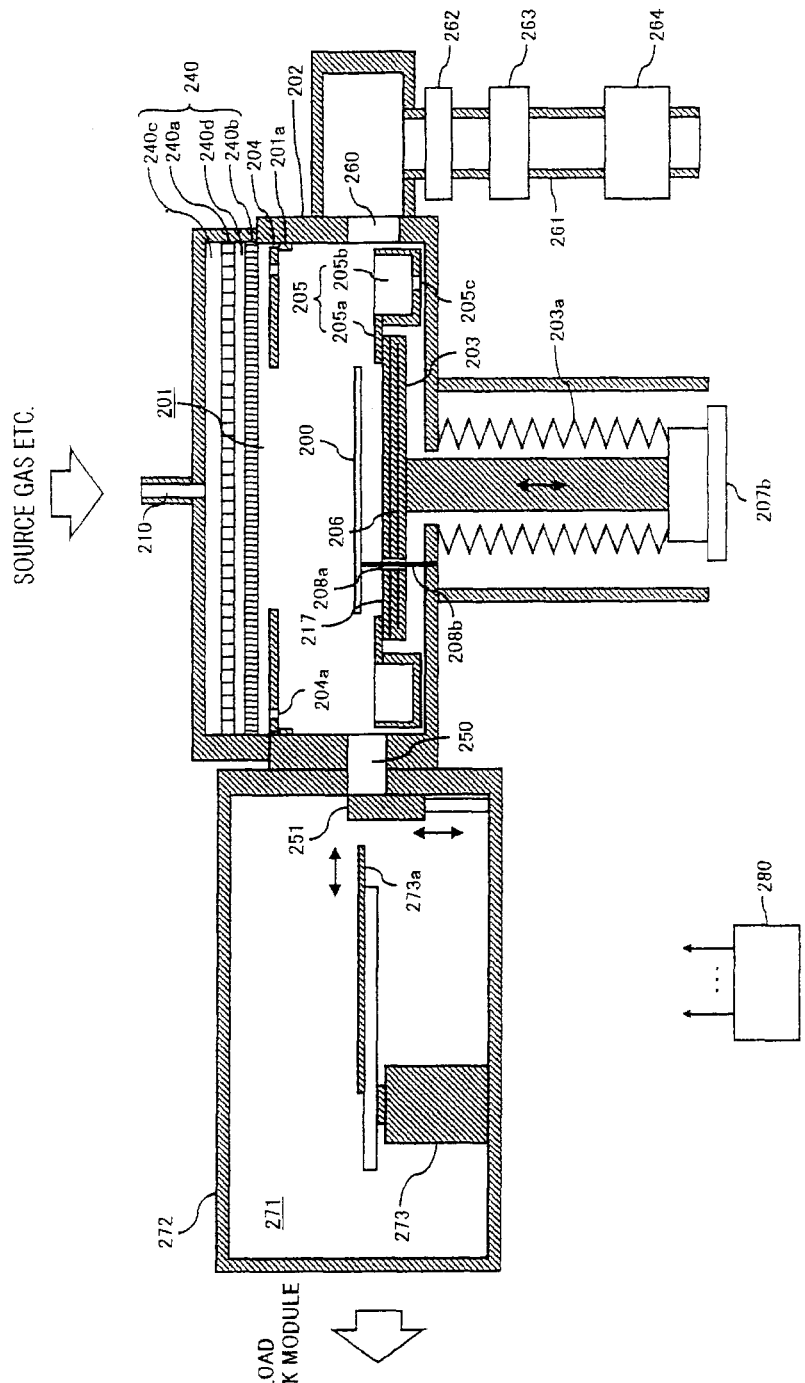
FIG. 4 is a sectional block diagram in wafer transfer of the substrate processing apparatus according to the first embodiment of the present invention.

As shown in FIGS. 3 and 4, the substrate processing apparatus according to this embodiment includes a processing container 202. The processing container 202 is constituted as a flat air-tight container having a circular horizontal sectional face. Also, the processing container 202 is constituted of metal materials such as aluminum (Al) and stainless (SUS). A processing chamber 201 for processing a wafer 200 as a substrate is constituted in the processing container 202.

A support rest 203 for supporting the wafer 200 is provided in the processing chamber 201. A susceptor 217 as a supporting plate constituted of quartz ($SiO_2$), carbon, ceramics, silicon carbide (SiC), aluminum oxide ($Al_2O_3$), or aluminum nitride (AlN), for example, is provided on an upper surface of the support rest 203 which is directly brought into contact with the wafer 200. Also, a heater 206 is incorporated in the support rest 203, as a heating unit that heats the wafer 200. Note that a lower end portion of the support rest 203 is passed through a bottom part of the processing container 202.

An elevating mechanism 207b is provided outside of the processing chamber 201. By operating this elevating mechanism 207b, the wafer 200 supported on the susceptor 217 can be elevated. The support rest 203 is lowered to a position shown in FIG. 4 (wafer transferring position) in transferring the wafer 200, and is elevated to a position shown in FIG. 3 (wafer processing position) shown in FIG. 3 in processing the wafer 200. Note that the lower end portion of the support rest 203 and the circumference of the elevating mechanism 207b are covered with a bellows 203a, and the inside of the processing chamber 201 is air-tightly maintained.

In addition, for example, three lift pins 208b are vertically provided on the bottom surface (floor surface) of the processing chamber 201. Further, through holes 209a for passing through such lift pins 208b are provided on the support rest 203, at positions corresponding to the lift pins 208b respectively. Then, when the support rest 203 is lowered to the wafer transferring position, upper end portions of the lift pins 208b are protruded from the upper surface of the support rest 203, so that the wafer 200 can be supported from under by the lift pins 208b. In addition, when the support rest 203 is elevated to the wafer processing position, the lift pins 208b are embedded from the upper surface of the support rest 203, so that the wafer 200 is supported from under by the susceptor 217 provided on the upper surface of the support rest 203. Note that the lift pins 208b are directly brought into contact with the wafer 200, and therefore preferably are formed of a material such as quartz and aluminum.

<Wafer Transfer Port>

A wafer transfer port 250 is provided on a side face of an inner wall of the processing chamber 201, for transferring the wafer 200 into/from the processing chamber 201. A gate valve 251 is provided in the wafer transfer port 250, and by opening the gate valve 251, the inside of the processing chamber 201 and the inside of a transfer chamber (preliminary chamber) 271 are communicated with each other. The transfer chamber 271 is formed in the air-tight container 272, and a transfer robot 273 for transferring the wafer 200 is provided in the transfer chamber 271. A transfer arm 273a is provided in the transfer robot 273, for supporting the wafer 200 in transferring the wafer 200. By opening the gate valve 251 in a state of lowering the support rest 203 to the wafer transferring position, the wafer 200 can be transferred between the inside of the processing chamber 201 and the inside of the transfer chamber 271 by the transfer robot 273. The wafer 200 transfered into the processing chamber 201 is temporarily placed on the lift pins 208b as described above.

<Exhaust System>

An exhaust port 260 for exhausting atmosphere in the processing chamber 201 is provided on the side face of the inner wall of the processing chamber 201 and on the opposite side of the wafer transfer port 250. An exhaust pipe 261 is connected to the exhaust port 260, and a pressure adjusting unit 262 such as an APC (Auto Pressure Controller) for controlling the inside of the processing chamber 201 to a prescribed pressure, a liquid source recovering trap 263, and a vacuum pump 264 are connected to the exhaust pipe 261 in series. An exhaust system (exhaust line) is mainly constituted of the exhaust port 260, the exhaust pipe 261, the pressure adjusting unit 262, the liquid source recovering trap 263, and the vacuum pump 264.

<Gas Inlet Port>

A gas inlet port 210 for supplying each kind of gas into the processing chamber 201 is provided on an upper surface (ceiling wall) of a shower head 240 as will be described later which is provided in an upper part of the processing chamber 201. Note that the structure of a gas supply system connected to the gas inlet port 210 will be described later.

<Shower Head>

The shower head 240 as a gas dispersion mechanism is provided between the gas inlet port 210 and the wafer 200 at a wafer processing position. The shower head 240 includes a dispersion plate 240a for dispersing the gas introduced from the gas inlet port 210 and a shower plate 240b for further uniformly dispersing the gas passed through the dispersion plate 240a and supplying this gas to the surface of the wafer 200 on the support rest 203. A plurality of ventilation holes are provided on the dispersion plate 240a and the shower plate 240b. The dispersion plate 240a is disposed so as to oppose to the upper surface of the shower head 240 and the shower plate 240b, and the shower plate 240b is disposed so as to oppose to the wafer 200 on the support rest 203. Note that spaces are formed between the upper surface of the shower head 240 and the dispersion plate 240a, and between the dispersion plate 240a and the shower plate 240b. Such spaces function respectively as a dispersion chamber (first buffer space) for dispersing the gas supplied from the gas inlet port 210, and a second buffer space 240d for dispersing the gas passed through the dispersion plate 240a.

<Exhaust Duct>

A step part 201a is provided on the side face of the inner wall of the processing chamber 201. Then, this step part 201a is constituted so as to hold a conductance plate 204 in the vicinity of the wafer processing position. The conductance plate 204 is constituted as a disc plate having a donut shape (ring shape), with a hole for containing the wafer 200 formed in an inner peripheral part. A plurality of discharging ports 204a arranged in a peripheral direction at prescribed intervals are provided on an outer peripheral part of the conductance plate 204. The discharging ports 204a are discontinuously formed, so that the inner peripheral part of the conductance plate 204 can be supported by the outer peripheral part of the conductance plate 204.

Meanwhile, a lower plate 205 is locked to the outer peripheral part of the support rest 203. The lower plate 205 includes a ring-shaped recess portion 205b and a flange part 205a provided integrally with an upper part of the inside of the recess portion 205b. The recess portion 205b is provided so as to block a gap between the outer peripheral part of the support rest 203 and the side face of the inner wall of the processing chamber 201. A plate exhaust port 205c is provided in a part of the vicinity of the exhaust port 260 of the bottom part of the recess portion 205b, for discharging (circulating) the gas to the side of the exhaust port 260 from the inside of the recess portion 205b. The flange part 205a functions as a locking part to be locked onto an upper outer peripheral edge of the support rest 203. By locking the flange part 205a onto the upper outer peripheral edge of the support rest 203, the lower plate 205 is elevated/lowered together with the support rest 203, along with elevation/lowering of the support rest 203.

When the support rest 203 is elevated to the wafer processing position, the lower plate 205 is also elevated to the wafer processing position. As a result, the conductance plate 204 held in the vicinity of the wafer processing position blocks the upper surface portion of the recess portion 205b of the lower plate 205, thus forming an exhaust duct 259, with inside of the recess portion 205b set as a gas flow passage region. Note that at this time, the inside of the processing chamber 201 is partitioned into an upper processing chamber above the exhaust duct 259, and a lower processing chamber below the exhaust duct 259. The conductance plate 204 and the lower plate 205 are preferably constituted of a material that can be held at a high temperature such as quartz for high load and resistant to high temperature.

Here, explanation will be given for a gas flow in the processing chamber 201 in processing the wafer. First, the gas supplied to an upper part of the shower head 240 from the gas inlet port 210 passes through the dispersion chamber (first buffer space) 240c and enters into the second buffer space 240d from a plurality of holes of the dispersion plate 240a, and further passes through a plurality of holes of the shower plate 240b, then supplied into the processing chamber 201, and supplied onto the wafer 200 uniformly. Then, the gas supplied onto the wafer 200 is flowed radially toward outside of the wafer 200. Then, extra gas after being brought into contact with the wafer 200 is flowed over the exhaust duct 259 (namely over the conductance plate 204) provided on an outer periphery of the support rest 203, radially toward outside of the wafer 200, and is discharged from the discharging port 204a provided on the exhaust duct 259 into the region of the gas flow passage in the exhaust duct 259. Thereafter, the gas is flowed into the exhaust duct 259, passes through the plate exhaust port 205c and is discharged to the exhaust port 260. As described above, it is possible to suppress a gas flow coming round to a lower part of the processing chamber 201, namely to the sides of a rear face of the support rest 203 and the bottom face of the processing chamber 201.

Figure 1:
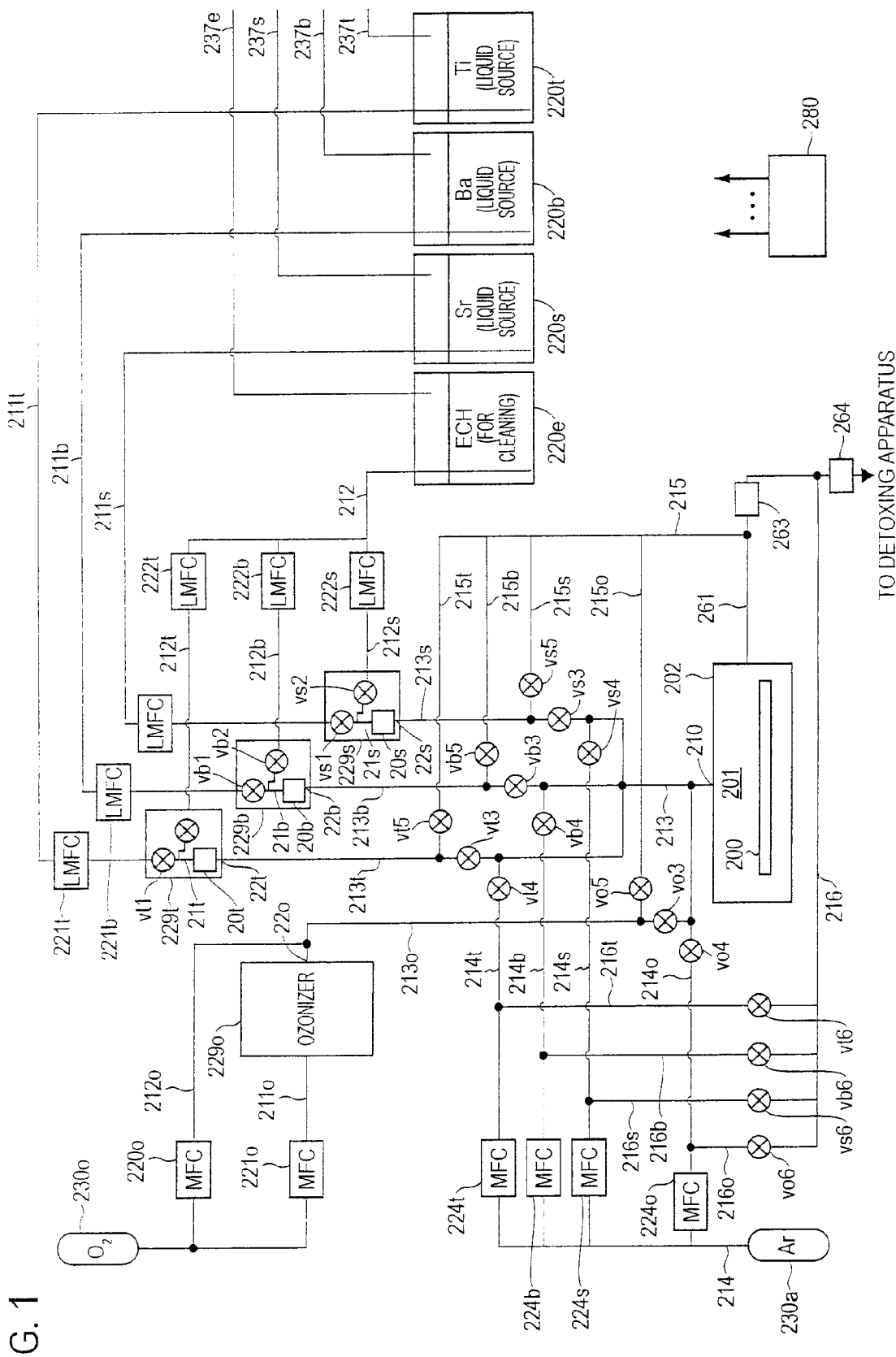
FIG. 1 is a block diagram of a gas supply system in a substrate processing apparatus according to a first embodiment of the present invention.
Figure 6:
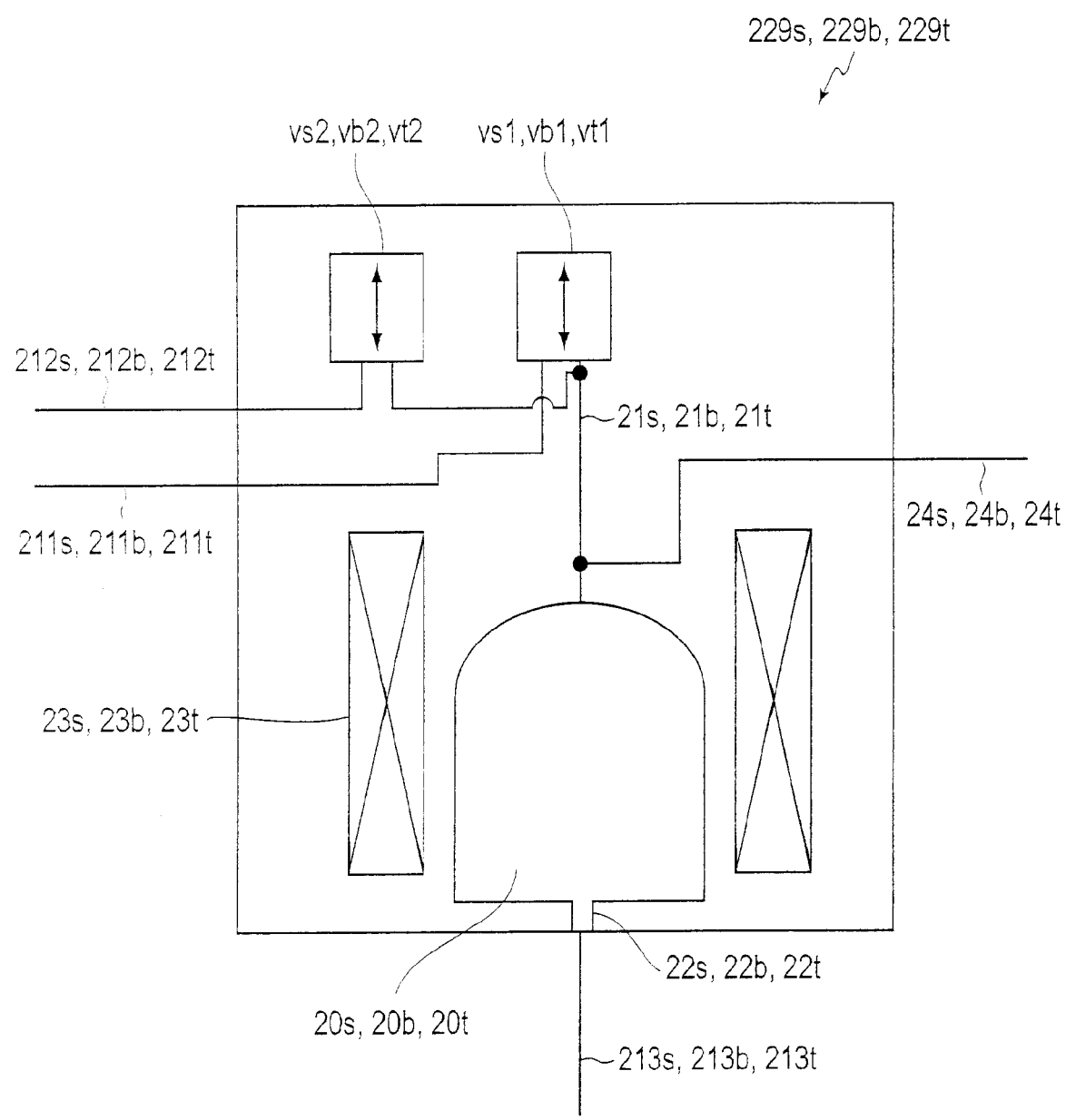
FIG. 6 is a schematic block diagram of a vaporizer according to the first embodiment of the present invention.

Subsequently, explanation will be given for the structure of a gas supply system connected to the aforementioned gas inlet port 210, with reference to FIGS. 1 and 6. FIG. 1 is a block diagram of the gas supply system (gas supply line) of the substrate processing apparatus according to a first embodiment of the present invention, and FIG. 6 is a schematic block diagram of the vaporizer according to the first embodiment of the present invention.

The gas supply system of the substrate processing apparatus according to the first embodiment of the present invention includes a vaporizer that vaporizes a liquid source; a liquid source supply system that supplies the liquid source to the vaporizer; a liquid source gas supply system that supplies the source gas obtained by vaporizing the liquid source in the vaporizer into the processing chamber 201; a reaction gas supply system that supplies into the processing chamber 201 a reaction gas different from the source gas; and a cleaning liquid supply system that supplies cleaning liquid (solvent) to the vaporizer. Further, the substrate processing apparatus according to the first embodiment of the present invention has a purge gas supply system and a ventilation (bypass) system. The structure of each part will be explained hereunder.

<Liquid Source Supply System>

Outside of the processing chamber 201, there are provided a first liquid source supply source 220s for supplying organic metal liquid source (called a first liquid source hereunder) containing Sr (strontium) as the liquid source, a second liquid source supply source 220b for supplying organic metal liquid source (called a second liquid source) containing Ba (barium), and a third liquid source supply source 220t for supplying organic metal liquid source (called a third liquid source) containing Ti (titanium). The first liquid source supply source 220s, the second liquid source supply source 22b, and the third liquid source supply source 220t are respectively constituted as a tank (air-tight container) capable of storing (filling) the liquid source inside. Note that each organic metal liquid source containing Sr, Ba, Ti is diluted to 0.05 mol/L to 0.2 mol/L by the solvent such as ECH (ethylcyclohexane) and THF (tetrahydrofuran), and then stored respectively in a tank.

Here, a first pressurized gas supply pipe 237c, a second pressurized gas supply pipe 237b, and a third pressurized gas supply pipe 237t are respectively connected to the first liquid source supply source 220s, the second liquid source supply source 220b, and the third liquid source supply source 220t. A pressurized gas supply source not shown is connected to upper stream side end portions of the first pressurized gas supply pipe 237c, the second pressurized gas supply pipe 237b, and the third pressurized gas supply pipe 237t. In addition, lower stream side end portions of the first pressurized gas supply pipe 237s, the second pressurized gas supply pipe 237b, and the third pressurized gas supply pipe 237t are respectively communicated with a space that exists in an upper part of the first liquid source supply source 220s, the second liquid source supply source 220b, and the third liquid source supply source 220t, so that a pressurized gas is supplied into this space. Note that preferably the gas not reacted with the liquid source is used as the pressurized gas, and for example inert gas such as Ar gas is suitably used.

In addition, a first liquid source supply pipe 211s, a second liquid source supply pipe 211b, and a third liquid source supply pipe 211t are respectively connected to the first liquid source supply source 220s, the second liquid source supply source 220b, and the third liquid source supply source 220t. Here, the upper stream side end portions of the first liquid source supply pipe 211s, the second liquid source supply pipe 211b, and the third liquid source supply pipe 211t are immersed into the liquid source stored in the first liquid source supply source 220s, the second liquid source supply source 220b, and the third liquid source supply source 220t, respectively. Also, the lower stream side end portions of the first liquid source supply pipe 211s, the second liquid source supply pipe 211b, and the third liquid source supply pipe 211t are connected to vaporizers 229s, 229b, 229t as vaporizers for vaporizing the liquid source, respectively. Note that liquid flow controllers (LMFC) 221s, 221b, 221t as a flow rate control unit that control a supply flow rate of the liquid source and open/close valves vs1, vb1, vt1 that control supply of the liquid source are respectively provided in the first liquid source supply pipe 211s, the second liquid source supply pipe 211b, and the third liquid source supply pipe 211t. Note that the open/close valves vs1, vb1, vt1 are provided inside of the vaporizers 229s, 229b, and 229t, respectively.

With this structure, by opening the open/close valves vs1, vb1, vt1, and supplying the pressurized gas from the first pressurized gas supply pipe 237s, the second pressurized gas supply pipe 237b, and the third pressurized gas supply pipe 237t, the liquid source can be fed (supplied) under pressure to the vaporizers 229s, 229b, 229t from the first liquid source supply source 220s, the second liquid source supply source 220b, and the third liquid source supply source 220t. The liquid source supply system (liquid source supply line) is mainly constituted of the first liquid source supply source 220s, the second liquid source supply source 220b, the third liquid source supply source 220t, the first pressurized gas supply pipe 237s, the second pressurized gas supply pipe 237b, the third pressurized gas supply pipe 237t, the first liquid source supply pipe 211s, the second liquid source supply pipe 211b, the third liquid source supply pipe 211t, the liquid flow controllers 221s, 221b, 221t, and the open/close valves vs1, vb1, vt1.

<Vaporizer>

A detailed structure of the vaporizers 229s, 229b, 229t as the vaporizers for vaporizing the liquid source is shown in FIG. 6, including: vaporizing chambers 20s, 20b, 20t that generates a source gas by heating the liquid source by heaters 23s, 23b, 23t to be vaporized; liquid source flow passages 21s, 21b, 21t, being the flow passages for discharging the liquid source to these vaporizing chambers 20s, 20b, 20t; the aforementioned open/close valves vs1, vb1, vt1 that control the supply of the liquid source to the vaporizing chambers 20s, 20b, 29t; and source gas supply ports 22s, 22b, 22t as outlets for supplying the source gas generated in the vaporizing chambers 20s, 20b, 20t to a first source gas supply pipe 213s, a second source gas supply pipe 213b, and a third source gas supply pipe 213t as will be described later. The lower stream side end portions of the aforementioned first liquid source supply pipe 211s, the second liquid source supply pipe 211b, and the third liquid source supply pie 211t are connected to the upper stream side end portions of the liquid source flow passages 21s, 21b, 21t via the open/close valves vs1, vb1, vt1, respectively. Carrier gas supply pipes 24s, 24b, 24t as carrier gas supply systems (carrier gas supply lines) are connected to the liquid source flow passages 21s, 21b, 21t, so that carrier gas such as Ar is supplied into the vaporizing chambers 20s, 20b, 20t.

<Source Gas Supply System>

The upper stream side end portions of the first source gas supply pipe 213s, the second source gas supply pipe 213b, and the third source gas supply pipe 213t for supplying the source gas into the processing chamber 201 are respectively connected to the source gas supply ports 22s, 22b, 22t of the aforementioned vaporizers 229s, 229b, 229t. The lower streams side end portions of the first source gas supply pipe 213s, the second source gas supply pipe 213b, and the third source gas supply pipe 213t are combined into a single source gas supply pipe 213 so as to be merged with each other, and the single source gas supply pipe 213 is connected to the gas inlet port 210. Note that open/close valves vs3, vb3, vt3 that control the supply of the source gas into the processing chamber 201 are respectively provided in the first source gas supply pipe 213s, the second source gas supply pipe 213b, and the third source gas supply pipe 213t.

With this structure, the liquid source is vaporized by the vaporizers 229s, 229b, 229t, to generate the source gas, and by opening open/close valves vs3, vb3, vt3, the source gas can be supplied into the processing chamber 201 via the first source gas supply pipe 213s, the second source gas supply pipe 213b, and the third source gas supply pipe 213t, via the source gas supply pipe 213. The source gas supply system (source gas supply line) is mainly constituted of the first source gas supply pipe 213c, the second source gas supply pipe 213b, the third source gas supply pipe 213t, the source gas supply pipe 213, and the open/close valves vs3, vb3, vt3.

<Cleaning Liquid Supply System (Solvent Supply System)>

In addition, a cleaning liquid supply source (solvent supply source) 220e is provided outside of the processing chamber 201, for supplying ECH (ethylcyclohexane), being the solvent as the cleaning liquid. The cleaning liquid supply source 220e is constituted as a tank (air-tight container) capable of storing (filling) the cleaning liquid inside. Note that the cleaning liquid is not limited to ECH, and the solvent such as THF (tetrahydrofuran) can also be used.

Here, a cleaning liquid pressurized gas supply pipe 237e is connected to the cleaning liquid supply source 2203. A pressurized gas supply source not shown is connected to the upper stream side end portion of the cleaning liquid pressurized gas supply pipe 237e. In addition, the lower stream side end portion of the cleaning liquid pressurized gas supply pipe 237e is communicated with a space that exists in the upper part of the cleaning liquid supply source 220e, so that the pressurized gas is supplied into this space. Note that the inert gas such as Ar is suitably used as the pressurized gas.

In addition, a cleaning liquid supply pipe (solvent supply pipe) 212 is connected to the cleaning liquid supply source 220e. The upper stream side end portion of the cleaning liquid supply pipe 212 is immersed into the cleaning liquid stored in the cleaning liquid supply source 220e. The lower stream side end portion of the cleaning liquid supply pipe 212 is connected to three lines, namely, the first cleaning liquid supply pipe 212s, the second cleaning liquid supply pipe 212b, and the third cleaning liquid supply pipe 212t, so as to be branched into them. The lower stream side end portions of the first cleaning liquid supply pipe 212s, the second cleaning liquid supply pipe 212b, and the third cleaning liquid supply pipe 212t are connected to the liquid source flow passages 21s, 21b, 21t of the vaporizers 229s, 229b, 229t, respectively. Note that liquid flow controllers 222s, 222b, 222t as flow rate control units for controlling a supplied flow rate of the cleaning liquid are respectively provided in the first cleaning liquid supply pipe 212s, the second cleaning liquid supply pipe 212b, and the third cleaning liquid supply pipe 212t. Note that the open/close valves vs21, vb2, vt2 are respectively provided inside of the vaporizers 229s, 229b, and 229t, respectively.

With this structure, the pressurized gas is supplied from the cleaning liquid pressurized gas supply pipe 237e, and by closing the open/close valves vs1, vb1, vt1 and opening the open/close valves vs2, vb2, vt2, the cleaning liquid is fed (supplied) under pressure into the liquid source flow passages 21s, 21b, 21t of the vaporizers 229s, 229b, and 229t, and the inside of the liquid source flow passages 21s, 21b, 21t can be cleaned. The cleaning liquid supply system (solvent supply system), namely the cleaning liquid supply line (solvent supply line) is mainly constituted of the cleaning liquid supply source 220e, the cleaning liquid pressurized gas supply pipe 237e, the cleaning liquid supply pipe 212, the first cleaning liquid supply pipe 212s, the second cleaning liquid supply pipe 212b, the third cleaning liquid supply pipe 212t, the liquid flow controllers 222s, 222b, 222t, and the open/close valves vs2, vb2, vt2.

<Reaction Gas Supply System>

In addition, an oxygen gas supply source 230o is provided outside of the processing chamber 201, for supplying oxygen ($O_2$). The upper stream side end portion of the first oxygen gas supply pipe 2110 is connected to the oxygen gas supply source 230o. An ozonizer 2290 is connected to the lower stream side end portion of the first oxygen gas supply pipe 211o, for generating ozone gas as a reaction gas (reaction substance), namely ozone gas as an oxidizing agent from the oxygen gas by plasma. Note that a flow rate controller 221o as a flow rate control unit for controlling the supply flow rate of the oxygen gas is provided in the first oxygen gas supply pipe 211o.

The upper stream side end portion of the ozone gas supply pipe 213o as a reaction gas supply pipe is connected to an ozone gas supply port 22o as an outlet of the ozonizer 229o. In addition, the lower stream side end port ion of the ozone gas supply pipe 213o is connected to the source gas supply pipe 213 so as to merge with the source gas supply pipe 213. Namely, the ozone gas supply pipe 213o is constituted to supply ozone gas as a reaction gas into the processing chamber 201. Note that an open/close valve vo3 for controlling the supply of the ozone gas into the processing chamber 201 is provided in the ozone gas supply pipe 213o.

The upper stream side end portion of the second oxygen gas supply pipe 212o is connected to the upper stream side beyond the flow rate controller 221o of the first oxygen gas supply pipe 211o. In addition, the lower stream side end portion of the second oxygen gas supply pipe 212o is connected to the upper stream side beyond the open/close valve vo3 of the ozone gas supply pipe 213o. Note that a flow rate controller 222o as a flow rate control unit for controlling the supply flow rate of the oxygen gas is provided in the second oxygen gas supply pipe 212o.

With this structure, the oxygen gas is supplied to the ozonizer 229o to generate the ozone gas, and by opening the open/close valve vo3, the ozone gas can be supplied into the processing chamber 201. Note that if the oxygen gas is supplied from the second oxygen gas supply pipe 212o during supplying the ozone gas into the processing chamber 201, the ozone gas supplied into the processing chamber 201 is diluted with the oxygen gas, and concentration of the ozone gas can be adjusted. The reaction gas supply system (reaction gas supply line) is mainly constituted of the oxygen gas supply source 230o, the first oxygen gas supply pipe 211o, the ozonizer 229o, the flow rate controller 221o, the ozone gas supply pipe 213o, the open/close valve vo3, the second oxygen gas supply pipe 212o, and the flow rate controller 222o.

<Purge Gas Supply System>

In addition, an Ar gas supply source 230a is provided outside of the processing chamber 201, for supplying Ar gas as a purge gas. The upper stream side end portion of the purge gas supply pipe 214 is connected to the Ar gas supply source 230a. The lower stream side end portion of the purge gas supply pipe 214 is connected to four lines, namely a first purge gas supply pipe 214s, a second purge gas supply pipe 214b, a third purge gas supply pipe 214t, and a fourth purge gas supply pipe 214o so as to branched into them. In addition, flow rate controllers 224s, 224b, 224t, 224o, as flow rate control units for controlling the supply flow rate of the Ar gas, and open/close valves vs4, vb4, vt4, vo4 for controlling the supply of the Ar gas are respectively provided in the first purge gas supply pipe 214s, the second purge gas supply pipe 214b, the third purge gas supply pipe 214t, and the fourth pure gas supply pipe 214o. The purge gas supply system (purge gas supply line) is mainly constituted of the Ar gas supply source 230a, the purge gas supply pipe 214, the first purge gas supply pipe 214s, the second purge gas supply pipe 214b, the third purge gas supply pipe 214t, the fourth purge gas supply pipe 214o, the flow rate controllers 224s, 224b, 224t, 224o, and the open/close valves vs4, vb4, vt4, vo4.

<Ventilation (Bypass) System>

Further, the upper stream side end portions of a first ventilation pipe 215s, a second ventilation pipe 215b, a third ventilation pipe 215t, and a fourth ventilation pipe 215o are respectively connected to the upper stream side of the open/close valves vs3, vb3, vt3, vo3 of the first source gas supply pipe 213s, the second source gas supply pipe 213b, the third source gas supply pipe 213t, and the ozone gas supply pipe 213o. In addition, the lower stream side end portions of the first ventilation pipe 215s, the second ventilation pipe 215b, the third ventilation pipe 215t, and the fourth ventilation pipe 215o are combined into a single ventilation pipe 215 so as to be merged with each other, and the ventilation pipe 215 is connected to the upper stream side beyond a liquid source recovering trap 263 of the exhaust pipe 261. Open/close valves vs5, vb5, vt5, vo5 for controlling the supply of the gas are respectively provided in the first ventilation pipe 215s, the second ventilation pipe 215b, the third ventilation pipe 215t, and the fourth ventilation pipe 215o.

With this structure, by closing the open/close valves vs3, vb3, vt, vo3 and opening the open/close valves vs5, vb5, vt5, and vo5, the gas flowing through the first source gas supply pipe 213s, the second source gas supply pipe 213b, the third source gas supply pipe 213t, and the ozone gas supply pipe 213o can bypass the processing chamber 201 without being supplied into the processing chamber 201, and can be exhausted to outside of the processing chamber 201.

In addition, a fifth ventilation pipe 216s, a sixth ventilation pipe 216b, a seventh ventilation pipe 216t, and an eighth ventilation pipe 216o are respectively connected to the upper stream sides beyond the open/close valves vs4, vb4, vt4, vo4 of the first purge gas supply pipe 214s, the second purge gas supply pipe 214b, the third purge gas supply pipe 214t, and the fourth purge gas supply pipe 214o, and to the lower stream sides beyond the flow rate controllers 224s, 224b, 224t, 224o. In addition, the lower stream side end portions of the fifth ventilation pipe 216s, the sixth ventilation pipe 216b, the seventh ventilation pipe 216t, and the eighth ventilation pipe 216o are combined into a single ventilation pipe 216 so as to merge with each other, and the ventilation pipe 216 is connected to the lower streams side beyond the liquid source recovering trap 263 of the exhaust pipe 261 and to the upper stream side beyond a vacuum pump 264. Open/close valves vs6, vb6, vt6, and vo6 for controlling the supply of the gas are respectively provided in the fifth ventilation pipe 216s, the sixth ventilation pipe 216b, the seventh ventilation pipe 216t, and the eighth ventilation pipe 216o.

With this structure, by closing the open/close valves vs4, vb4, vt4, and vo4, and by opening the open/close valves vs6, vb6, vt6, and vo6, the Ar gas flowing through the first purge gas supply pipe 214s, the second purge gas supply pipe 214b, the third purge gas supply pipe 214t, and the fourth purge gas supply pipe 214o can bypass the processing chamber 201 without being supplied into the processing chamber 201 and can be discharged to the outside of the processing chamber 201 respectively. Note that by closing the open/close valves vs3, vb3, vt3, vo3 and by opening the open/close valves vs5, vb5, vt5, and vo5, the gas flowing through the first source gas supply pipe 213s, the second source gas supply pipe 213b, the third source gas supply pipe 213t, and the ozone gas supply pipe 213o, bypasses the processing chamber 201 without being supplied into the processing chamber 201 and is discharged to the outside of the processing chamber 201 respectively. In this case, by opening the open/close valves vs4, vb4, vt4, vo4, the Ar gas is introduced into the first source gas supply pipe 213s, the second source gas supply pipe 213b, the third source gas supply pipe 213t, and the ozone gas supply pipe 213o, and the inside of each source gas supply pipe is purged. Also, the open/close valves vs6, vb6, vt6, vo6 are set to operate reversely to the open/close valves vs4, vb4, vt4, and vo4, and when the Ar gas is not supplied into each source gas supply pipe, the processing chamber 201 is bypassed to exhaust the Ar gas. The ventilation system (bypass system), namely a ventilation line (bypass line) is mainly constituted of the first ventilation pipe 215s, the second ventilation pipe 215b, the third ventilation pipe 215t, the fourth ventilation pipe 215o, the ventilation pipe 215, the fifth ventilation pipe 216s, the sixth ventilation pipe 216b, the seventh ventilation pipe 216t, the eighth ventilation pipe 216o, the ventilation pipe 216, the open/close valves vs5, vb5, vt5, vo5, and the open/close valves vs6, vb6, vt6, vo6.

<Controller>

Note that the substrate processing apparatus according to this embodiment has a controller 280 for controlling the operation of each part of the substrate processing apparatus. The controller 280 controls the operation of a gate valve 251, an elevating mechanism 207b, a transfer robot 273, a heater 206, a pressure adjuster (APC) 262, vaporizers 229s, 229b, 229t, an ozonizer 229o, a vacuum pump 264, open/close valves vs1 to vs6, vb1 to vb6, vt1 to vt6, vo3 to vo6, liquid flow rate controllers 221s, 221b, 221t, 222s, 222b, 222t, flow rate controllers 224s, 224b, 224t, 221o, 222o, 224o, etc.

As described above, the substrate processing apparatus according to the first embodiment of the present invention is constituted.

(2) Substrate Processing Step

Figure 2:
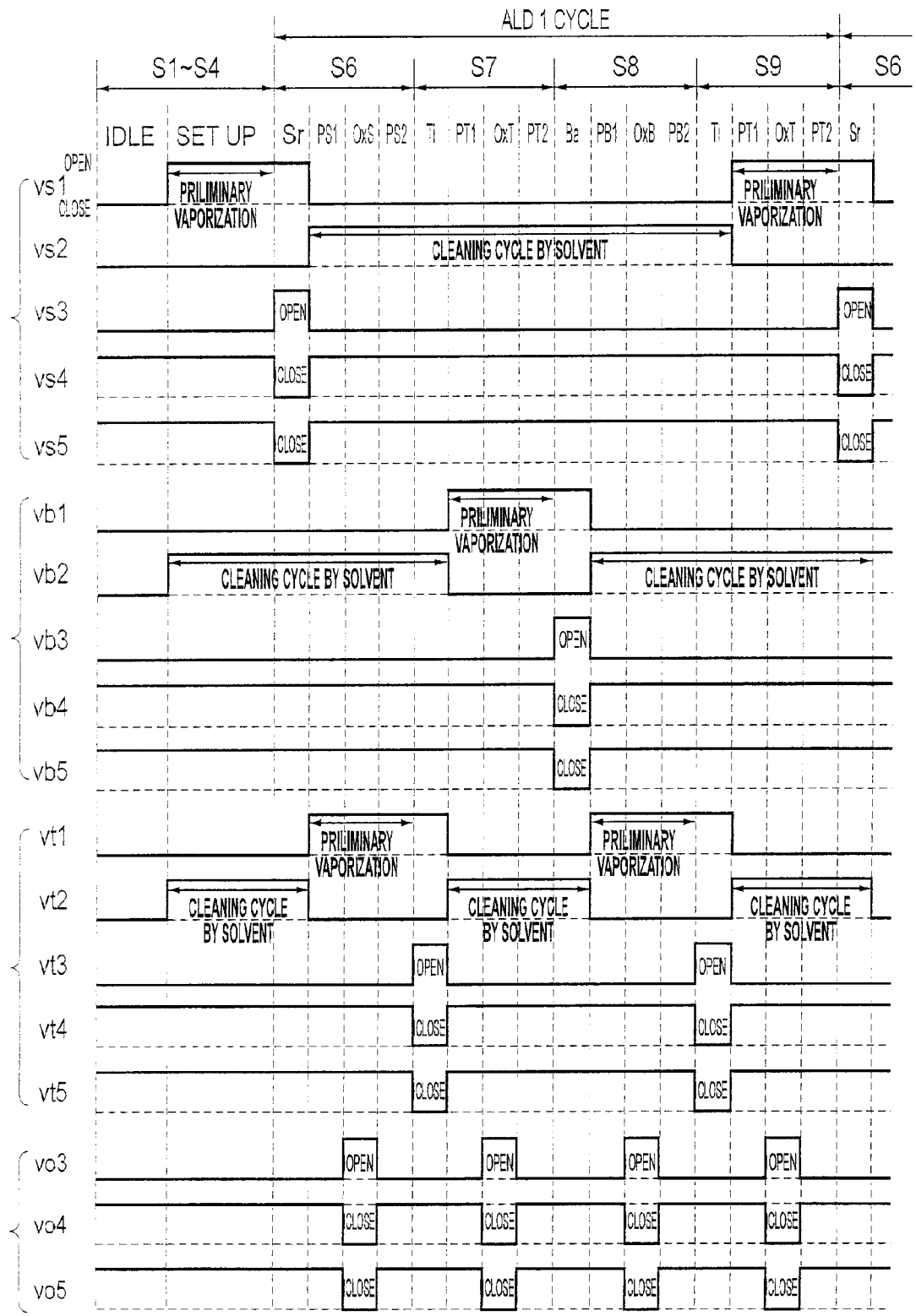
FIG. 2 is a sequence chart showing an opening/closing timing of each valve in the substrate processing apparatus according to the first embodiment of the present invention.
Figure 5:
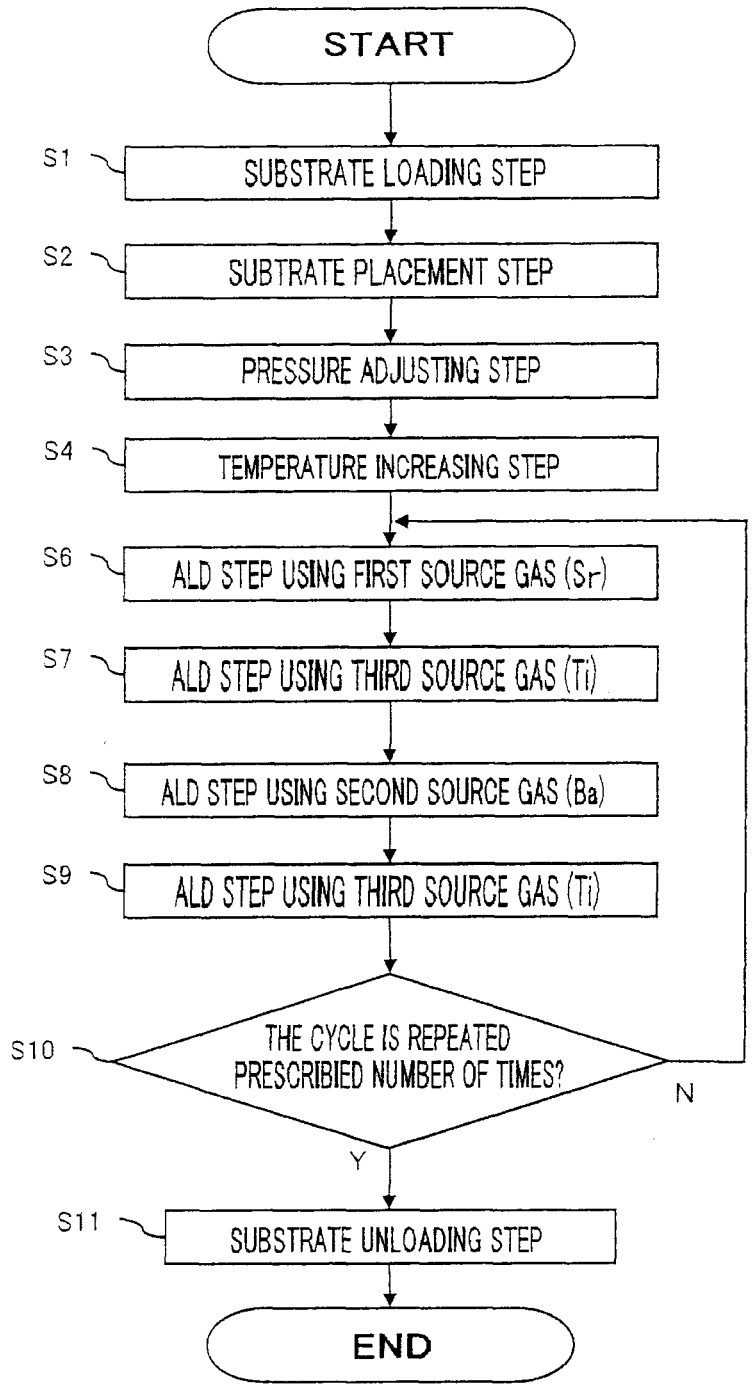
FIG. 5 is a flowchart of a substrate processing step according to the first embodiment of the present invention.

Subsequently, explanation will be given for a substrate processing step for forming a thin film on the wafer by an ALD method by using the aforementioned substrate processing apparatus, as one step of a manufacturing step of the semiconductor device according to a first embodiment of the present invention, with reference to FIG. 5 and FIG. 2. FIG. 5 is a flowchart of the substrate processing step according to the first embodiment of the present invention. Also, FIG. 2 is a sequence chart as a timing chart showing an opening/closing timing of each valve of the substrate processing apparatus according to the first embodiment of the present invention. In this timing chart, High level shows open of the valve and Low level shows close of the valve. Note that in the explanation given hereunder, the operation of each part constituting the substrate processing apparatus is controlled by the controller 280.

<Substrate Loading Step (S1), Substrate Placement Step (S2)>

First, the elevating mechanism 207b is operated, and the support rest 203 is lowered to the wafer transferring position shown in FIG. 4. Then, the gate valve 251 is opened, and the processing chamber 201 and the transfer chamber 271 are communicated with each other. Then, the wafer 200, being a processing object, is loaded into the processing chamber 201 from the inside of the transfer chamber 271 by the transfer robot 273 in a state of being supported by the transfer arm 273a (S1). The wafer 200 loaded into the processing chamber 201 is temporarily placed on the lift pins 208b protruded from the upper surface of the support rest 203. When the transfer arm 273a of the transfer robot 273 returns to the inside of the transfer chamber 271 from the inside of the processing chamber 201, the gate valve 251 is closed.

Subsequently, the elevating mechanism 207b is operated, and the support rest 203 is elevated to the wafer processing position shown in FIG. 3. As a result, the lift pins 208b are embedded from the upper surface of the support rest 203, and the wafer 200 is placed on a susceptor 217 on the upper surface of the support rest 203 (S2).

<Pressure Adjusting Step (S3), Temperature Increasing Step (S4)>

Subsequently, the pressure in the processing chamber 201 is controlled to be a prescribed processing pressure, by the pressure adjuster (APC) 262. In addition, power supplied to the heater 206 is adjusted, and a surface temperature of the wafer 200 is controlled to be a prescribed processing temperature (S4).

Note that in the substrate loading step (S1), the substrate placement step (S2), the pressure adjusting step (S3), and the temperature increasing step (S4), the open/close valves vs3, vb3, vt3, and vo3 are closed while operating the vacuum pump 264, and the open/close valves vs4, vb4, vt4, vo4 are opened, thereby always flowing the Ar gas into the processing chamber 201 (idle). Thus, it is possible to prevent adhesion of particles onto the wafer 200.

In parallel to the steps S1 to S4, the source gas obtained by vaporizing the first liquid source (the organic metal liquid source containing Sr element) is generated (preliminarily vaporized) (Setup). Namely, the open/close valve vs1 is opened, with the open/close valve vs2 closed, and the pressurized gas is supplied from the first pressurized gas supply pipe 237c, and the first liquid source is fed under pressure (supplied) to the vaporizer 229s from the first liquid source supply source 220s, then the first liquid source is vaporized in the vaporizer 229s, to generate the first source gas. In this preliminary vaporizing step, by opening the open/close valve vs5, with the open/close valve vs3 closed, while operating the vacuum pump 264, the processing chamber 201 is bypassed and exhausted without supplying the first source gas into the processing chamber 201.

In addition, in parallel to the steps S1 to S4, it is preferable that ozone gas, being the reaction substance, is generated (Setup). Namely, the oxygen gas is supplied from the oxygen gas supply source 230o to the ozonizer 229o, and the ozone gas is generated by the ozonizer 229o. At this time, by opening the open/close valve vo5, with the open/close valve vo3 closed, while operating the vacuum pump 264, the processing chamber 201 is bypassed and exhausted without supplying the ozone gas into the processing chamber 201.

A prescribed time is required for stably generating the first source gas by the vaporizer 229s or stably generating the ozone gas by the ozonizer 229o. Therefore, in this embodiment, the first source gas or the ozone gas is previously generated, and by switching opening/closing of the open/close valves vss3, vs5, vo3, vo5, the flow passage of the first source gas or ozone gas is switched. As a result, by switching of the open/close valve, stable supply of the first source gas and the ozone gas into the processing chamber 201 can be speedily started or stopped, and this is preferable. Simultaneously with this preliminary vaporizing step, the open/close valves vb2, vt2 are opened, and insides of the liquid source flow passages 21b, 21t of the vaporizers 229b, 229t are started to be cleaned. Note that details of a cleaning method will be described later.

<ALD Step (S6) Using the First Source Gas>

Subsequently, the Open/Close Valves Vs4, Vs5 are closed and the open/close valve vs3 is opened, with the vacuum pump 264 operated, and supply of the first source gas into the processing chamber 201 is started (Sr). The first source gas is dispersed by the shower head 240 and is uniformly supplied onto the wafer 200 in the processing chamber 201, thus allowing gas molecules of the first source gas to adsorb on the surface of the wafer 200. Surplus first source gas is flowed into the exhaust duct 259, and is exhausted to the exhaust port 260. Note that when the first source gas is supplied into the processing chamber 201, preferably the open/close valves vb4, vt4, vo4 are remained to be opened, so as to prevent invasion of the first source gas into the second source gas supply pipe 213b, the third source gas supply pipe 213t, and the ozone gas supply pipe 213o, and urge diffusion of the first source gas in the processing chamber 201, and Ar gas is always flowed into the processing chamber 201.

After the open/close valve vs3 is opened and supply of the first source gas is started, after a prescribed time is elapsed, the open/close valve vs3 is closed, and the open/close valves vs4, vs5 are opened, to stop the supply of the first source gas into the processing chamber 201. In addition, simultaneously, the open/close valve vs1 is closed, and the supply of the first liquid source into the vaporizer 229s is also stopped.

Here, after the open/close valve vs3 is closed and the supply of the first source gas is stopped, Ar gas is always flowed into the processing chamber 201, with the open/close valves vs4, vb4, vt4, vo4 opened. Thus, the first source gas remained in the processing chamber 201 is removed, and the inside of the processing chamber 201 is purged by Ar gas (PS1).

Also, after the open/close valve vs1 is closed, and the supply of the first liquid source is stopped, cleaning inside of the vaporizer 229s is started (PS1~). Namely, the pressurized gas is supplied from the cleaning liquid pressurized gas supply pipe 237e, and the open/close valve vs2 is opened, with the open/close valve vs1 closed, and the cleaning liquid is supplied into the liquid source flow passage 21s of the vaporizer 229s, to clean the inside of the liquid source flow passage 21s. At this time, the open/close valves vs1, vs3 are set to be Close, and the open/close valves vs2, vs5 are set to be Open. Therefore, the cleaning liquid supplied into the liquid source flow passage 21s cleans the inside of the liquid source flow passage 21s, and is supplied into the vaporizer 20s, and is thereby vaporized. At this time, the first liquid source and a solvent remained in the liquid source flow passage 21s are also supplied into the vaporizer 20s and vaporized. Then, the vaporized cleaning liquid, the first liquid source, and the solvent are passed through the first source gas supply pipe 213s, bypasses the processing chamber 201 from the vent pipe 215s without being supplied into the processing chamber 201, and is exhausted. Note that cleaning inside of the liquid source flow passage 21s of the vaporizer 229s is continued until start of the supply of the first liquid source to the vaporizer 229s next time (until Ti of S9).

When purge inside of the processing chamber 201 is completed, the open/close valves vo4, vo5 are closed, and the open/close valve vo3 is opened, to start the supply of the ozone gas into the processing chamber 201 (OxS). The ozone gas is dispersed by the shower head 240, and is uniformly supplied onto the wafer 200 in the processing chamber 201, then reacts with the gas molecules of the first source gas adsorbed on the surface of the wafer 200, thereby generating on the wafer 200 a SrO film as a thin film containing Sr element. Surplus ozone gas and a reaction by-product are flowed into the exhaust duct 259, and exhausted to the exhaust port 260. Note that when the ozone gas is supplied into the processing chamber 201, preferably the open/close valves vs4, vb4, vt4 are remained to be opened so as to prevent the invasion of the ozone gas into the first source gas supply pipe 213s, the second source gas supply pipe 213b, and the third source gas supply pipe 213t, and so as to urge the dispersion of the ozone gas in the processing chamber 201, so that Ar gas in the processing chamber is always flowed.

After the open/close valve vo3 is opened and supply of the ozone gas is started, when a prescribed time is elapsed, the open/close valve vo3 is closed, and the open/close valve vo4, vo5 are opened, to stop the supply of the ozone gas into the processing chamber 201.

After the open/close valve vo3 is closed and the supply of the ozone gas is stopped, Ar gas is always flowed into the processing chamber 201, with the open/close valves vs4, vb4, vt4, vo4 opened. Thus, the ozone gas and the reaction by-product remained in the processing chamber 201 are removed, and the inside of the processing chamber 201 is purged by Ar gas (PS2).

Note that in the ALD step (S6) using the first source gas, the source gas (referred to as third source gas hereunder) obtained by vaporizing the third liquid source (organic metal liquid source containing Ti element) is previously generated (preliminarily vaporized) (PS1~). Namely, the open/close valve vt2 is closed, and the open/close valve vt1 is opened, and also the pressurized gas is supplied from the third pressurized gas supply pipe 237t, then the third liquid source is supplied to the vaporizer 229t from the third liquid source supply source 220t, and the third liquid source is vaporized by the vaporizer 229t, and the third source gas is thereby generated. In the ALD step (S6) using the first source gas, by opening the open/close valve vt5, with the open/close valve vt3 while operating the vacuum pump 264, the processing chamber 201 is bypassed and the inside of the processing chamber 201 is exhausted without supplying the third source gas into the processing chamber 201. Thus, by previously generating the third source gas and switching the open/close of the open/close valves vt3, vt5 in the ALD step (S7) using the third source gas as will be described later, the flow passage of the third source gas is switched. Thus, in the ALD step (S7) using the third source gas, stable supply of the third source gas into the processing chamber 201 can be speedily started or stopped, and this is preferable.

<ALD Step (S7) Using the Third Source Gas>

Subsequently, the open/close valves vt4, vt5 are closed and the open/close valve vt3 is opened, with the vacuum pump 264 operated, the supply of the third source gas into the processing chamber 201 is started (Ti). The third source gas is dispersed by the shower head 240 and is uniformly supplied onto the wafer 200 in the processing chamber 201, and the gas molecules of the third source gas are adsorbed on the surface of the wafer 200. Surplus third source gas is flowed into the exhaust duct 259 and is exhausted to the exhaust port 260. Note that in supplying of the third source gas into the processing chamber 201, preferably Ar gas is always flowed into the processing chamber 201, with the open/close valves vs4, vb4, vo4 opened, so as to prevent the invasion of the third source gas into the first source gas supply pipe 213s, the second source gas supply pipe 213b, and the ozone gas supply pipe 213o, and so as to urge dispersion of the third source gas in the processing chamber 201.

After the open/close valve vt3 is opened, and the supply of the third source gas is started, after elapse of a prescribed time, the open/close valve vt3 is closed and the open/close valves vt4, vt5 are opened, to stop the supply of the third source gas into the processing chamber 201. In addition, simultaneously, the open/close valve vt1 is closed, and the supply of the third liquid source into the vaporizer 229t is also stopped.

Here, after the open/close valve vt3 is closed and the supply of the third source gas is stopped, the open/close valves vs4, vb4, vt4, vo4 are remained to be opened, and Ar gas is always flowed into the processing chamber 201. Thus, the third source gas remained in the processing chamber 201 is removed, and the inside of the processing chamber 201 is purged by Ar gas (PT1).

In addition, after the open/close valve vt1 is closed and the supply of the third liquid source is stopped, cleaning of the inside of the vaporizer 229t is started (PT1~). Namely, the pressurized gas is supplied from the cleaning liquid pressurized gas supply pipe 237e and the open/close valve vt2 is opened, with the open/close valve vt1 closed, and the cleaning liquid is supplied into the liquid source flow passage 21t of the vaporizer 229t, and the inside of the liquid source flow passage 21t is cleaned. At this time, the open/close valves vt1, vt3 are set to be Close, and the open/close valves vt2, vt5 are set to be Open, and therefore after the inside of the liquid source flow passage 21t is cleaned, the cleaning liquid supplied into the liquid source flow passage 21t is supplied into the vaporizer 20t and is vaporized. At this time, the third liquid source and the solvent remained in the liquid source flow passage 21t are also supplied into the vaporizer 20s and vaporized. Then, the vaporized cleaning liquid, the third liquid source, and the solvent are passed through the third source gas supply pipe 213t, and bypass the processing chamber 201 without being supplied into the processing chamber 201, and exhausted from the vent pipe 215t. Note that cleaning in the liquid source flow passage 21t of the vaporizer 229t is continued, for example, until start of the supply of the third liquid source to the vaporizer 229t next time (up to Ba of S8).

When the purge of the inside of the processing chamber 201 is completed, the open/close valves vo4, vo5 are closed, and the open/close valve vo3 is opened, to start the supply of the ozone gas into the processing chamber 201 (OxT). The ozone gas is dispersed by the shower head 240 and is uniformly supplied onto the wafer 200 in the processing chamber 201, and reacts with the gas molecules of the third source gas adsorbed on the surface of the wafer 200, to generate a $TiO_2$ film as the thin film containing Ti on the wafer 200. Surplus ozone gas and the reaction by-product is flowed through the exhaust duct 259, and is exhausted to the exhaust port 260. Note that in supplying the ozone gas into the processing chamber 201, preferably the open/close valves vs4, vb4, vt4 are opened and Ar gas is always flowed into the processing chamber 201, with the open/close valves vs4, vb4, vt4 opened, so as to prevent the invasion of the ozone gas into the first source gas supply pipe 213s, the second source gas supply pipe 213b, and the third source gas supply pipe 213t, and so as to urge the dispersion of the ozone gas in the processing chamber 201.

After the open/close valve vo3 is opened, and the supply of the ozone gas is started, after elapse of a prescribed time, the open/close valve vo3 is closed and the open/close valves vo4, vo5 are opened, to stop the supply of the ozone gas into the processing chamber 201.

After the open/close valve vo3 is closed and the supply of the ozone gas is stopped, Ar gas is always flowed into the processing chamber 201, with the open/close valves vs4, vb4, vt4, vo4 opened. Thus, the ozone gas and the reaction by-product remained in the processing chamber 201 are removed, and the inside of the processing chamber 201 is purged by Ar gas (PT2).

Note that in the ALD step (S7) using the third source gas, the source gas (called a second source gas hereunder) obtained by vaporizing the second liquid source (the organic metal liquid source containing Ba element) is previously generated (preliminarily vaporized) (PT1~). Namely, the open/close valve vb2 is closed and the open/close valve vb1 is opened, and the pressurized gas is supplied from the second pressurized gas supply pipe 237b, then the second liquid source is supplied to the vaporizer 229b from the second liquid source supply source 220b, the second liquid source is vaporized by the vaporizer 229b, and the second source gas is thereby generated. In the ALD step (S7) using the third source gas, by opening the open/close valve vb5, the processing chamber 201 is bypassed and the inside of the processing chamber 201 is exhausted without supplying the second source gas into the processing chamber 201. Thus, the second source gas is previously generated, and by switching the opening/closing of the open/close valves vb3, vb5 in the ALD step (S8) using the second source gas as will be described later, the flow passage of the second source gas is switched. Thus, in the ALD step using the second source gas (S8), stable supply of the second source gas into the processing chamber 201 can be speedily started or stopped, and this is preferable.

<ALD Step (S8) Using the Second Source Gas>

Subsequently, the open/close valves vb4, vb5 are closed and the open/close valve vb3 is opened, while operating the vacuum pump 264, and the supply of the second source gas into the processing chamber 201 is started (Ba). The second source gas is dispersed by the shower head 240, and is uniformly supplied onto the wafer 200 in the processing chamber 201, so that the gas molecules of the second source gas are adsorbed on the surface of the wafer 200. Surplus second source gas is flowed through the exhaust duct 259, and is exhausted to the exhaust port 260. Note that in supplying the second source gas into the processing chamber 201, preferably Ar gas is always flowed into the processing chamber 201, with the open/close valves vs4, vt4, vo4 opened, so as to prevent the invasion of the second source gas to the first source gas supply pipe 213s, the third source gas supply pipe 213t, the ozone gas supply pipe 213o, and so as to urge the dispersion of the second source gas in the processing chamber 201.

After the open/close valve vb3 is opened, and the supply of the second source gas is started, after elapse of a prescribed time, the open/close valve vb3 is closed, and the open/close valves vb4, vb5 are opened, to stop the supply of the second source gas into the processing chamber 201. In addition, simultaneously, the open/close valve vb1 is closed, and the supply of the second liquid source to the vaporizer 229b is also stopped.

Here, after the open/close valve vb3 is closed and the supply of the second source gas is stopped, Ar gas is always flowed into the processing chamber 201, with the open/close valves vs4, vb4, vt4, vo4 opened. Thus, the second source gas remained in the processing chamber 201 is removed, and the inside of the processing chamber 201 is purged by Ar gas (PB1).

In addition, after the open/close valve vb1 is closed, and the supply of the second liquid source is stopped, cleaning of the inside of the vaporizer 229b is started (PB1~). Namely, the pressurized gas is supplied from the cleaning liquid pressurized gas supply pipe 237e and the open/close valve vb2 is opened, with the open/close valve vb1 closed, and the cleaning liquid is supplied into the liquid source flow passage 21b of the vaporizer 229b, to clean the inside of the liquid source flow passage 21b. At this time, the open/close valves vb1, vb3 are set to be Close, and the open/close valves vb2, vb5 are set to be Open. Therefore, the cleaning liquid supplied into the liquid source flow passage 21b cleans the inside of the liquid source flow passage 21b and thereafter is supplied into the vaporizer 20b and is vaporized. At this time, the second liquid source and the solvent remained in the liquid source flow passage 21b are also supplied into the vaporizer 20b and vaporized. Then, the vaporized cleaning liquid, the second liquid source, and the solvent are passed through the second source gas supply pipe 213b, bypass the processing chamber 201 without being supplied into the processing chamber 201, and exhausted from the vent pipe 215b. Note that cleaning inside of the liquid source flow passage 21b of the vaporizer 229b is continued until start of the supply of the second liquid source to the vaporizer 229b next time (up to Ti of S7 next time).

When purge inside of the processing chamber 201 is completed, the open/close valves vo4, vo5 are closed and the open/close valve vo3 is opened, to start the supply of the ozone gas into the processing chamber 201 (OxB). The ozone gas is dispersed by the shower head 240, and is uniformly supplied onto the wafer 200 in the processing chamber 201, and reacts with the gas molecules of the second source gas adsorbed on the surface of the wafer 200, thereby generating a BaO film as a thin film containing Ba element on the wafer 200. Surplus ozone gas and the reaction by-product are flowed through the exhaust duct 259, and exhausted to the exhaust port 260. Note that in supplying the ozone gas into the processing chamber 201, preferably Ar gas is always flowed through the processing chamber 201, with the open/close valves vs4, vb4, vt4 opened, so as to prevent the invasion of the ozone gas into the first source gas supply pipe 213s, the second source gas supply pipe 213b, the third source gas supply pipe 213t, and so as to urge the dispersion of the ozone gas in the processing chamber 201.

After the open/close valve vo3 is opened and the supply of the ozone gas is started, after elapse of a prescribed time, the open/close valve vo3 is closed, and the open/close valves vo4, vo5 are opened, the supply of the ozone gas into the processing chamber 201 is stopped.

After the open/close valve vo3 is closed and the supply of the ozone gas is stopped, Ar gas is always flowed into the processing chamber 201, with the open/close valves vs4, vb4, vt4, vo4 opened. Thus, the ozone gas and the reaction by-product remained in the processing chamber 201 are removed, and the inside of the processing chamber 201 is purged by Ar gas (PB2).

Note that in the ALD step (S8) using the second source gas, the source gas (called the third source gas hereunder) obtained by vaporizing the third liquid source (the organic metal liquid source containing Ti element) is previously generated (preliminarily vaporized) (PB1~). Namely, the open/close valve vt2 is closed and the open/close valve vt1 is opened, and the pressurized gas is supplied from the third pressurized gas supply pipe 237t, then the third liquid source is supplied to the vaporizer 229t from the third liquid source supply source 220t, and the third liquid source is vaporized by the vaporizer 229t, to generate the third source gas. In the ALD step (S8) using the second source gas, by opening the open/close valve vt5, with the open/close valve vt3 closed, while operating the vacuum pump 264, the third source gas bypasses the processing chamber 201 without being supplied into the processing chamber 201 and is exhausted. Thus, the third source gas is previously generated and by switching the opening/closing the open/close valves vt3, vt5 in the ALD step (S9) using the third source gas as will be described later, the flow passage of the third source gas is switched. Thus, in the ALD step using the third source gas (S9), stable supply of the third source gas into the processing chamber 201 can be speedily started or stopped, and this is preferable.

<ALD Step (S9) Using the Third Source Gas>

Subsequently, similar step as the ALD step (S7) using the aforementioned third source gas is executed again and a TiO$_2$ film is generated as a thin film containing Ti element on the wafer 200.

<Repetition Step (S10)>

After the ALD step (S9) using the third source gas, steps S6 to S9 are set as one cycle, and by repeating this cycle prescribed number of times, a BST (barium strontium titanate) thin film, namely (Ba, Sr) TiO$_3$ thin film having a desired film thickness is formed on the wafer 200.

Thereafter, by a procedure reverse to the procedure shown in the aforementioned substrate loading step (S1) and the substrate placement step (S2), the wafer 200 after being formed with the thin film of prescribed thickness is unloaded from the processing chamber 201 to the transfer chamber 271, to complete the substrate processing step according to this embodiment.

Note that when a thin film forming step is performed by the ALD method, a processing temperature is controlled to be a temperature zone in which the source gas is not self-decomposed. In this case, when each source gas is supplied in the ALD step (S6 to S9) using each source gas, the source gas is adsorbed on the wafer 200 without being self-decomposed. In addition, when the ozone gas is supplied, by a reaction between the source gas molecule adsorbed on the wafer 200 and the ozone gas, the thin film of about less than 1 atomic layer (less than 1 Å) is formed on the wafer 200. Note that at this time, impurities such as C and H mixed in the thin film can be desorbed by the ozone gas.

Note that when the thin film of, for example, (Ba, Sr) $TiO_3$ is formed, as the processing condition of the wafer 200 according to this embodiment, examples are shown as follows:

processing temperature: 250 to 450° C.,
processing pressure: 10 to 200 Pa,
first liquid source ($Sr(C_{14}O_4H_{25})_2$ (abbreviated as $Sr(METHD)_2$) 0.1 mol/L ECH dilution) supply flow rate: 0.01 to 0.5 cc/min,
second liquid source ($Ba(C_{14}O_4H_{25})_2$ (abbreviated as $Ba(METHD)_2$) 0.1 mol/L ECH dilution) supply flow rate: 0.01 to 0.5 cc/min,
third liquid source ($Ti(C_6O_2H_{11})(C_{11}O_2H_{19})_2$ (abbreviated as $Ti(MPD)(THD)_2$) 0.1 mol/L ECH dilution) supply flow rate: 0.01 to 0.5 cc/min,
reaction substance (ozone gas) supply flow rate: 500 to 2000 sccm (ozone concentration 20 to 200 $g/Nm^3$),
cleaning liquid (ECH) supply flow rate: 0.05 to 0.5 cc/min,
temperature in the vaporizer (vaporizing chamber): about 250° C.
pressure in the vaporizer (vaporizing chamber): several to 10 Torr (133 to 1330 Pa). Note that in this embodiment, the solvent for diluting each liquid source and the cleaning liquid are the same substance (ECH).

(3) Effects According to the First Embodiment

According to this embodiment, it is not a technique of purging the inside of the liquid source flow passages 21s, 21b, 21t of the vaporizers 229s, 229b, 229t at the time other than supplying the source gas obtained by vaporizing the liquid source by the vaporizers 229s, 229b, 229t into the processing chamber 201, but is a technique of cleaning the inside of the vaporizers 229s, 229b, 229t by supplying the solvent (such as ECH) for diluting the liquid source. Thus, the inside of the liquid source flow passages 21s, 21b, 21t can be cleaned in a state that the liquid source is being diluted by the solvent and viscosity of the liquid source is low. Namely, it is possible to suppress a state in which only the solvent is vaporized first in the liquid source flow passages 21s, 21b, 21t, and only the organic metal liquid source remains.

In addition, according to this embodiment, immediately after closing the open/close valves vs1, vb1, vt1, namely, immediately after stopping the supply of the liquid source to the vaporizers 229s, 229b, 229t, cleaning of the inside of the vaporizers 229s, 229b, 229t is started. Therefore, it is possible to suppress a state in which after the supply of the liquid source to the vaporizers 229s, 229b, 229t is stopped, the organic metal liquid source remains in the liquid source flow passages 21s, 21b, 21t, and insides of the liquid source flow passages 21s, 21b, 21t are blocked.

As described above, according to this embodiment, it is possible to accelerate the removal of the organic metal liquid source from the inside of the liquid source flow passages 21s, 21b, 21t of the vaporizers 229s, 229b, 229t when the supply of the liquid source to the vaporizers 229s, 229b, 229t is stopped, and suppress the blockage of the inside of the liquid source flow passages 21s, 21b, 21t by the organic metal liquid source.

<Other Embodiments of the Present Invention>

According to the aforementioned embodiment, lower stream side end portions of the first source gas supply pipe 213s, the second source gas supply pipe 213b, and the third source gas supply pipe 213t are combined into one so as to be merged with one another, to become a source gas supply pipe 213, and the source gas supply pipe 213 thus combined into one is connected to the gas inlet port 210. However, the present invention is not limited thereto. Namely, the lower stream side end portions of the first source gas supply pipe 213s, the second source gas supply pipe 213b, and the third source gas supply pipe 213t may be directly connected to an upper surface (ceiling wall) of the shower head 240.

In addition, according to the aforementioned embodiment, the lower stream side end portion of the ozone gas supply pipe 213o is connected to the source gas supply pipe 213 so as to be merged therewith. However, the present invention is not limited to the aforementioned embodiment. Namely, the lower stream side end portion of the ozone gas supply pipe 213o may be directly connected to the upper surface (ceiling wall) of the shower head 240.

Further, according to the aforementioned embodiment, explanation has been given for a case in which the inside of the liquid source flow passages 21s, 21b, 21t of each of the vaporizers 229s, 229b, 229t are cleaned for every single supply operation of each source gas to the processing chamber 201. However, the present invention is not limited to the aforementioned embodiment. Namely, cleaning of the inside of the liquid source flow passages 21s, 21b, 21t of the vaporizers 229s, 229b, 229t may be performed for multiple number of times of supply operations, such as two-supply operations of each source gas. However, as described in the aforementioned embodiment, cleaning for every single supply operation is more preferable, because cleaning inside of the liquid source flow passages 21s, 21b, 21t of each of the vaporizers 229s, 229b, 229t is accelerated, and vaporizing operation of the liquid source becomes further stable.

In addition, in the aforementioned embodiment, cleaning operation inside of the liquid source flow passages 21s, 21b, 21t of each of the vaporizers 220s, 220b, 229t is always performed at the time other than performing the vaporizing operation. However, the present invention is not limited to the aforementioned embodiment. For example, the cleaning operation inside of the liquid source flow passages 21s, 21b, 21t of each of the vaporizers 229s, 229b, 229t may be stopped even at the time other than performing the vaporizing operation, provided that the organic metal liquid sources in the liquid source flow passages 21s, 21b, 21t are removed.

Further, reversely, the cleaning operation inside of the liquid source flow passages 21s, 21b, 21t of each of the vaporizers 229s, 229b, 229t may be performed not only at the time other than performing the vaporizing operation of the liquid source but also at the time of performing the vaporizing operation of the liquid source. Namely, irrespective of the time of performing the vaporizing operation of the liquid source or other time, the cleaning liquid may be continued to be supplied into the liquid source flow passages 21s, 21b, 21t of each of the vaporizers 229s, 229b, 229t at all times. In such a case, the cleaning liquid supplied into the liquid source flow passages 21s, 21b, 21t also functions as a part of the solvent for diluting the liquid source at the time of performing the vaporizing operation of the liquid source. In this case, like the aforementioned embodiment, preferably the solvent for diluting the liquid source and the cleaning liquid are selected to be the same substance. Note that when the cleaning liquid is supplied during vaporizing operation of the liquid source, it is preferable that quantity ratio of the liquid source, diluted solvent, and cleaning liquid is suitably adjusted. In such a case, for example, the flow rate of the cleaning liquid supplied at the time other than the vaporizing operation of the liquid source may be made larger than the flow rate of the cleaning liquid supplied at the time of vaporizing operation of the liquid source, and cleaning may be positively performed at the time other than the vaporizing operation of the liquid source. In addition, the flow rate of the cleaning liquid supplied at the time of vaporizing operation of the liquid source and the flow rate of the cleaning liquid supplied at the time other than the vaporizing operation of the liquid source are made to be constant, and it may be also preferable to perform a flushing operation, in which the flow rate of the cleaning liquid is made larger than the flow rate of the cleaning liquid supplied, at the time of the vaporizing operation of the liquid source and every time the vaporizing operation of the liquid source is performed prescribed number of times.

(Second Embodiment)

Next, the second embodiment of the present invention will be explained. According to the second embodiment, the aforementioned flushing operation, etc, will be mainly explained.

As described above, when the thin film containing the metal element is prepared in a semiconductor manufacturing step, the organic metal material obtained by chemically adding carbon, hydrogen, and nitrogen, etc, to metal atom, is used as a source in some cases. Vapor pressure is increased by using the organic metal, and the source can be treated as liquid at a temperature near normal temperature. Further, even in a case of the organic metal in a solid state at normal temperature and the liquid source having greatly high viscosity, it can be treated as the liquid of low viscosity by diluting (dissolving) in the solvent if solvable in the organic solvent and making a liquefied source (referred to as liquefied source hereunder). Such liquid source and liquefied source (in this specification, they are generally called simply liquid source in some cases) are vaporized by the vaporizer and thereafter supplied into the reaction chamber of the semiconductor manufacturing device and contributes to depositing a film. However, a conventional vaporizer has a problem described below.

In a case of the vaporizer for performing vaporization by a spray mechanism, the source is atomized and vaporized by spraying the liquid source into the vaporizing chamber through a thin nozzle. Accordingly, in a case of vaporizing the source having viscosity, the source adsorbed and remained on the inside of the thin nozzle of a sprayer to cause the blockage of the nozzle in some cases. In addition, the inside of the vaporizing chamber is maintained to a high temperature, for vaporizing the source which is atomized normally. However, even in a case of the liquid having low viscosity, the liquid source near the spray mechanism is decomposed by heat radiation, thereby causing blockage of the nozzle by a decomposed product in some cases. The decomposed product is hardly dissolved in the solvent in many cases, and there is no choice but to take a means such as disassembling for cleaning, etc.

Further, in the liquid source also, blockage of the pipe frequently occurs by a so-called "pre-leap" phenomenon. This phenomenon is caused in such a way that although the inside of the vaporizing chamber is maintained to be reduced pressure normally, the source is supplied in a normal pressure, and therefore the inside of a thin pipe of the sprayer is set in the reduced pressure toward the vaporizing chamber because the source is supplied in the normal pressure, then an easily vaporized solvent evaporates first into the vaporizing chamber, and a solid source, being a dissolved substance, and the liquid source having high viscosity, remain in the thin pipe. Such solid substance and liquid having high viscosity cause blockage of the pipe.

This embodiment describes an operation method of the vaporizer for vaporizing stably for a long period the source that easily causes the blockage to occur particularly in a spray mechanical part of the vaporizer, namely, a method of further suppressing the blockage inside of the liquid source flow passage by flushing operation, etc.

Figure 8:
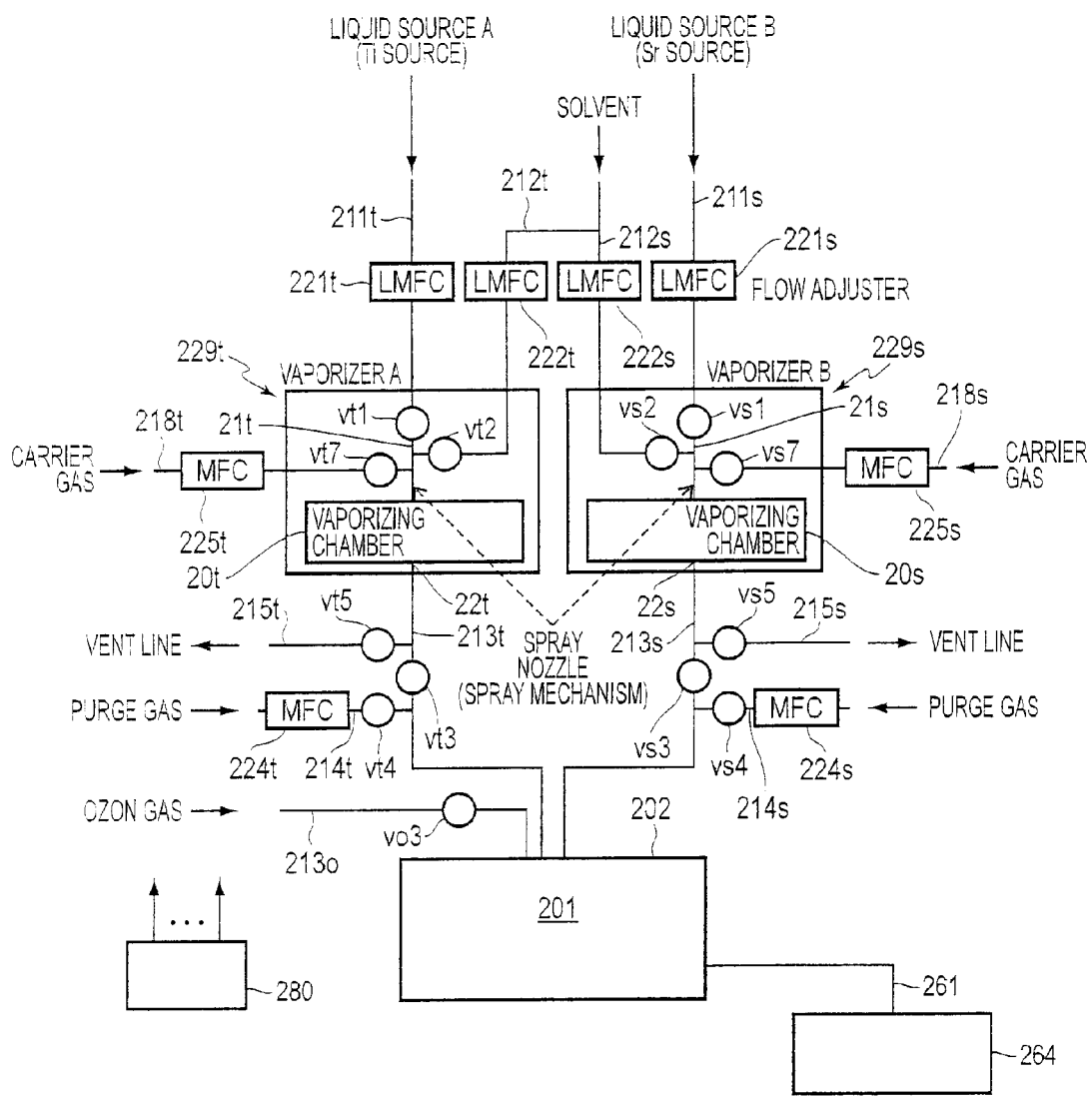
FIG. 8 is a block diagram of a gas supply system in such as substrate processing apparatus according to a second embodiment of the present invention.

FIG. 8 shows a constitutional example of a gas supply system of the substrate processing apparatus according to a second embodiment. Note that the gas supply system of the substrate processing apparatus according to the second embodiment shown in FIG. 8 shows an excerpt of two source supply lines of the gas supply system of the substrate processing in the first embodiment shown in FIG. 1, namely a line for supplying Sr source (first source) and a line for supplying Ti source (third source), and further a part of a line for supplying ozone gas (reaction gas). Structures of each supply line and the substrate processing apparatus according to the second embodiment are the same as structures of each supply line and the substrate processing apparatus according to the first embodiment. Note that in FIG. 8, substantially the same signs and numerals are assigned to the same element as the element explained in FIG. 1, and explanation therefore is omitted.

A pipe (liquid source supply pipe) for supplying the liquid source, a pipe (solvent supply pipe) for supplying the solvent capable of dissolving the source, and a carrier gas pipe (carrier gas supply pipe) are respective connected to the vaporizer according to this embodiment via a flow rate adjuster. In this embodiment, two vaporizers having this structure are used. Namely, the liquid source supply pipes 211*t*, 211*s*, the solvent supply pipes (cleaning liquid supply pipes) 212*t*, 212*s*, and the carrier gas supply pipes 218*t*, 218*s* are respectively connected to the vaporizers 229*t*, 220*s*, via flow rate adjusters 221*t*, 221*s*, 222*t*, 222*s*, 225*t*, 225*s*.

Figure 9:
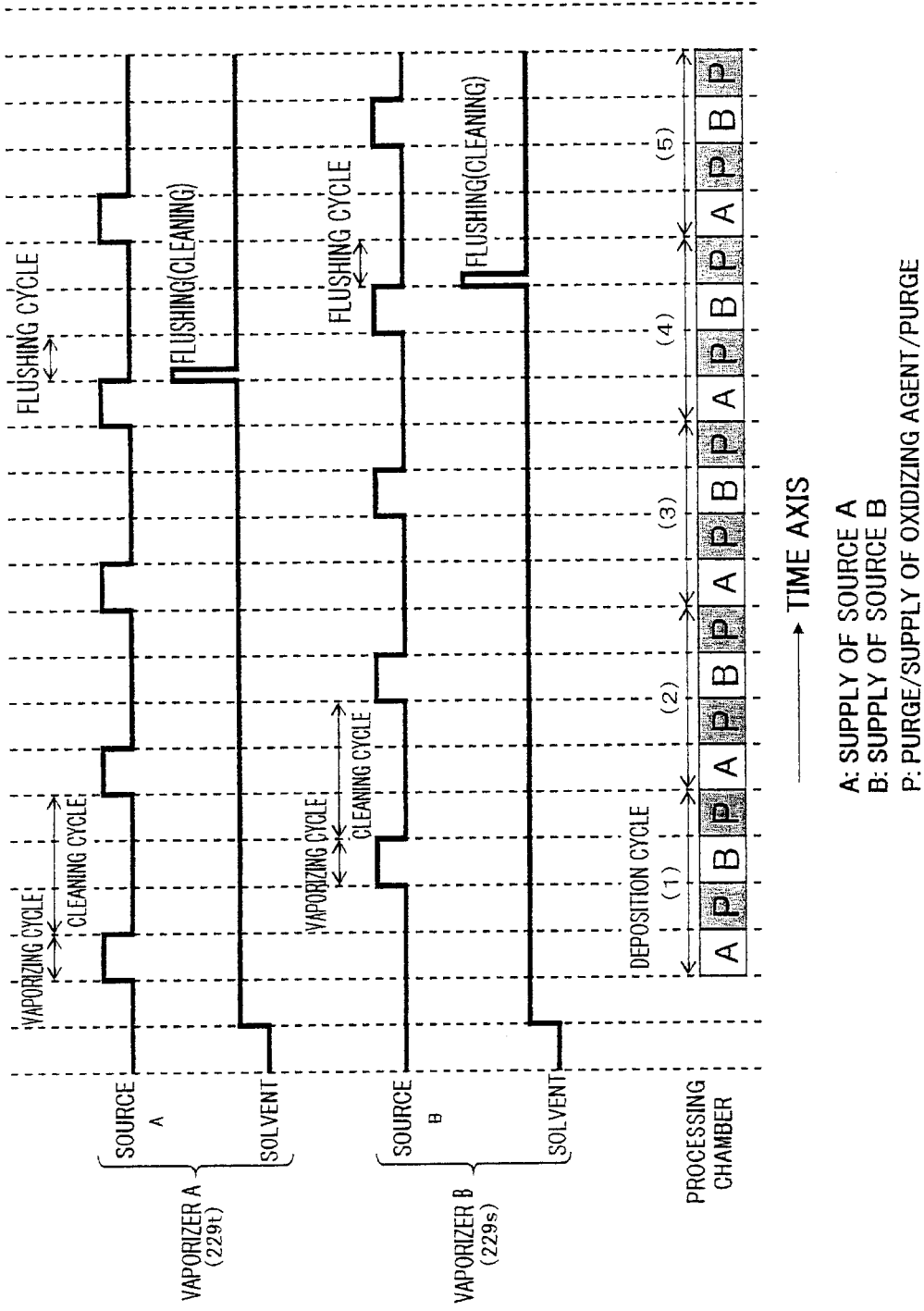
FIG. 9 is a sequence chart showing the timing of supply of a source and supply of a solvent to the vaporizer, and flushing operation in the substrate processing step according to the second embodiment of the present invention.

Hereunder, by using the aforementioned substrate processing apparatus according to the second embodiment, explanation will be given for a substrate processing step for forming the thin film on the wafer by the ALD method, by using two kinds of sources, as one step of the manufacturing steps of the semiconductor device. FIG. 9 is a sequence chart as a timing chart showing the timing of vaporizing operation by supplying sources to the vaporizers 229*t*, 229*s*, cleaning operation by supplying the solvent, and flushing operation by supplying a large flow of the solvent, in the substrate processing step according to the second embodiment of the present invention. In this timing chart, time is taken on the horizontal axis, and the flow rate of the source and the solvent is taken on the vertical axis. Note that in FIG. 9, the timing of supplying the carrier gas is omitted. In addition, this figure also shows the flow of each step (A, B, P) performed in the processing chamber 201. A, B, P showing each step performed in the processing chamber 201 respectively shows the supply of source A (Ti source), supply of source B (Sr source), and purge and supply of oxidizing agent (purge/supply of oxidizing agent/purge). Note that in the explanation given hereunder, the operation of each part constituting the substrate processing apparatus is controlled by the controller 280.

Only different part of the substrate processing step in the second embodiment from the substrate processing step in the first embodiment is the steps of S6 to S10 out of the substrate processing steps of the first embodiment, namely, the film deposition steps, substantially being the steps of depositing the thin film. Other steps of the first embodiment are the same as the steps of the second embodiment. The film deposition step will be explained hereunder.

When the vaporizing operation of the liquid source is performed for film deposition, first, the valves vt2, vs2, vt7, vs7 are opened, and the solvent whose flow rate is adjusted by the flow rate adjusters 222t, 222s of the solvent supply pipes 212t, 212s in both systems of sources A, B, is supplied into the vaporizing chambers 20t, 20s of the vaporizers 229t, 229s, together with the carrier gas whose flow rate is adjusted by the flow rate adjusters 225t, 225s of the carrier gas supply pipes 218t, 218s, and this solvent is vaporized. At this time, the valves vt3, vs3 are closed and the valves vt5, vs5 are opened, and therefore the vaporized solvent is exhausted to vent lines 215t, 215s. Note that at this time, the solvent is flowed into the vaporizing chambers 20t, 20s, with a first flow rate.

Next, the valve vt1 of the liquid source supply pipe 211t is opened, for supplying source A, and the source A whose flow rate is adjusted by the flow rate adjuster 221t is introduced into the vaporizing chamber 20t of the vaporizer 229t and is vaporized (vaporization cycle). At this time, the valve vt2 is remained to be opened, and the solvent supplied into the vaporizing chamber 20t from the solvent supply pipe 212t is continued to be flowed without being stopped, to thereby generate a mixed gas of the source A and the solvent in the vaporizing chamber 20t. Note that at this time, the valve vt7 is remained to be opened. At this time, the valves vt3, vs3 are remained to be closed and the valves vt5, vs5 are remained to be opened. Therefore, the mixed gas of the source A and the solvent is exhausted to the vent line 215t. Note that at this time also, the solvent is flowed into the vaporizing chamber 20t, at the first flow rate. However, when the liquid source is the liquefied source in which the solid substance and the liquid having viscosity are dissolved, the solvent is already contained in the source, and therefore supply of the solvent into the vaporizing chamber 20t from the solvent supply pipe 212t in a vaporization cycle is not indispensable and may be omitted.

Next, the vent line 215t and the valves vt5, vt3 of the source gas supply pipe 213t are switched. Namely, by closing the valve vt5 of the vent line 215t and opening the valve vt3 of the source gas supply pipe 213t, the mixed gas of the source A and the solvent is introduced into the processing chamber 201 (A).

After elapse of a prescribed time, the source gas supply pipe 213t and the valves vt3, vt5 of the vent line 215t are switched. Namely, by closing the valve vt3 of the source gas supply pipe 213t and opening the valve vt5 of the vent line 215t, introduction of the mixed gas of the source A and the solvent into the processing chamber 201 is stopped. Simultaneously, the valve vt4 of the purge gas supply pipe 214t is opened, and the purge gas is introduced into the processing chamber 201. On the side of the vaporizer 229t, the valve vt1 is closed, and the supply of the source A into the vaporizing chamber 20t is stopped. Then, by supplying only the solvent and the carrier gas into the vaporizing chamber 20t, with the valves vt2, vt7 opened, the source remained particularly in the vicinity of a spray nozzle (liquid source flow passage 21t), being the spray mechanism, is flushed away (cleaning cycle) Note that at this time also, the solvent is flushed away into the vaporizing chamber 20t at the first flow rate. Note that as a cleaning cycle, cleaning is performed continuously until the next vaporization cycle, namely until the source A is supplied into the vaporizing chamber 20t of the vaporizer 229t. In this period, remained gas of the source A in the processing chamber 201 is purged by purge gas, and after being purged, the oxidizing agent (ozone gas) is supplied into the processing chamber 201, and after elapse of a prescribed time, the inside of the processing chamber 201 is purged by the purge gas (P).

Next, the valve vs1 of the liquid source supply pipe 211s is opened, for supplying source B, and the source B whose flow rate is adjusted by the flow rate adjuster 221s is introduced into the vaporizing chamber 20s and is vaporized (vaporization cycle). At this time, the valve vs2 is remained to be opened, and the solvent supplied into the vaporizing chamber 20s from the solvent supply pipe 212s is continued to be flowed without being stopped, to generate the mixed gas of the source B and the solvent in the vaporizing chamber 20s. Note that at this time, the valve vs7 is also remained to be opened. At this time, the valves vt3, vs3 are closed, and the valves vt5, vs5 are remained to be opened, and therefore the mixed gas of the source B and the solvent is exhausted to the vent line 215s. Note that at this time also, the solvent is flowed into the vaporizing chamber 20s at the first flow rate. However, when the liquid source is the liquefied source in which the solid substance and the liquid having viscosity are dissolved, the solvent is already contained in the source, and therefore supply of the solvent into the vaporizing chamber 20s from the solvent supply pipe 212s in a vaporization cycle is not indispensable and may be omitted.

Next, the vent line 215s and the valves vs5, vs3 of the source gas supply pipe 213s are switched. Namely, by closing the valve vs5 of the vent line 215s and opening the valve vs3 of the source gas supply pipe 213s, the mixed gas of the source B and the solvent is introduced into the processing chamber 201 (B).

After elapse of a prescribed time, the source gas supply pipe 213s and the valves vs3, vs5 of the vent line 215s are switched. Namely, by closing the valve vs3 of the source gas supply pipe 213s and opening the valve vs5 of the vent line 215s, the introduction of the mixed gas of the source B and the solvent into the processing chamber 201 is stopped. Simultaneously, the valve vs4 of the purge gas supply pipe 214s is opened, and the purge gas is introduced into the processing chamber 201. On the side of the vaporizer 229s, by closing the valve vs1 and stopping the supply of the source B into the vaporizing chamber 20s, and supplying only the solvent and the carrier gas into the vaporizing chamber 20s, with the valves vs2, vs7 opened, the source remained in vaporizer 229s, particularly in the vicinity of the spray nozzle (liquid source flow passage 21s), being the spray mechanism, is flushed away (cleaning cycle). Note that at this time also, the solvent is flushed away into the vaporizing chamber 20s at the first flow rate. Note that as a cleaning cycle, cleaning is performed continuously until the next vaporization cycle, namely until the source B is supplied into the vaporizing chamber 20t of the vaporizer 229s. In this period, remained gas of the source B in the processing chamber 201 is purged by purge gas, and after being purged, the oxidizing agent (ozone gas) is supplied into the processing chamber 201, and after elapse of a prescribed time, the inside of the processing chamber 201 is purged by the purge gas (P)

As shown in FIG. 9, in the processing chamber 201, supply of the source A (A), purge, supply of the oxidizing agent, purge (P), supply of the source B (B), purge, supply of the oxidizing agent, purge (P) are set as one cycle (film deposition cycle), and this cycle is repeated prescribed number of times. Thus, an STO (strontium titanate) thin film of a prescribed thickness, namely a $SrTiO_3$ thin film is formed on the wafer 200. In this period, in the vaporizers 229t and 229s, the vaporizing cycle and the cleaning cycle are alternately repeated. Note that in the film deposition cycle, it is also preferable that supply of the source A (A), purge, supply of the oxidizing agent, purge (P), supply of the source B (B), purge, supply of the oxidizing agent, purge (P), are set as one cycle (film deposition cycle), and this cycle is repeated prescribed number of times. However, for example, supply of the source A (A), purge, supply of the source B (B), purge, supply of the oxidizing agent, purge are set as one cycle (film deposition cycle), and this cycle is repeated prescribed number of times. In these cases also, in the vaporizers 229$t$, 229$s$, the vaporization cycle and the cleaning cycle are alternately repeated. Note that in a case of FIG. 9, in the vaporizing cycle also, the solvent is continuously flowed to the vaporizers 229$t$, 229$s$. Therefore, in the vaporizing cycle, simultaneously with the vaporization of the source, cleaning of the vaporizers 229$t$, 229$s$ is performed. Namely, irrespective of the vaporization cycle and the cleaning cycle, cleaning of the vaporizers 229$t$, 229$s$ is continuously performed.

As described above, blockage of the vaporizers 229$t$, 229$s$ can be suppressed by the cleaning cycle after vaporization cycle. However, depending on the property of the source, as described above, there are also a case of continuously flowing the solvent to the vaporizers 229$t$, 229$s$ during the vaporization cycle, or a case of stop the solvent without being flowed, or a case of changing the flow rate.

The flushing operation for further suppressing the blockage of the vaporizers 229$t$, 229$s$ will be described hereunder. The flushing operation is the operation of cleaning the vaporizers 229$t$, 229$s$, at the time other than performing the vaporization cycle, namely, at the time of the cleaning cycle, and every time the vaporization cycle is performed prescribed number of times, with the flow rate of the solvent supplied to the vaporizers 229$t$, 229$s$ set as the flow rate of the solvent supplied at the time of a normal cleaning cycle and the vaporization cycle, namely, at a second flow rate, being a larger flow rate than the first flow rate. FIG. 9 shows an example of executing the flushing operation at the film deposition cycle (4) in the processing chamber 201, namely an example of executing the flushing operation, every time four vaporization cycles are performed four times. In FIG. 9, in the cleaning cycle after the vaporization cycle in the film deposition cycle (4), the solvent is temporarily supplied to the vaporizers 229$t$, 229$s$, with the flow rate of the solvent set at least twice the flow rate at the time of the normal cleaning cycle or the vaporization cycle. At this time, the flow rate of the carrier gas may also be changed.

It is sometimes difficult to completely remove a residue of the source adhered or remained in the vaporizers 229$t$, 229$s$, only by executing the normal cleaning cycle for every vaporization cycle. Then, by constantly repeating the vaporization cycle and the cleaning cycle without completely removing the residue of the source, the residue of the source in the vaporizers 229$t$, 229$s$ are sometimes cumulatively increased along with repetition. Meanwhile, by flowing a larger quantity of solvent than normal to a spray mechanism part of the vaporizers 229$t$, 229$s$ (liquid source flow passages 21$t$, 21$s$), every time the vaporization cycle of prescribed number of times is executed, a significantly greater cleaning effect than the cleaning effect in the normal cleaning cycle can be obtained, and the residue of the source that can not be completely removed in the normal cleaning cycle can be removed. Namely, by executing the flushing operation every time the vaporization cycle of prescribed number of times is executed, a constant repetition of the vaporization cycle and the cleaning cycle can be changed, and the residue of the source in the vaporizers 229$t$, 229$s$, which is cumulatively increased, can be removed. Then, a maintenance period of the vaporizers 229$t$, 229$s$ can be prolonged.

This operation cycle is called a flushing cycle. Frequency of execution, time, and the flow rate of the solvent for the flushing cycle, compared to the normal cleaning cycle, are different depending on the property of the source. Therefore, although experimentally obtained, regarding the frequency of execution, it is effective to execute flushing for every vaporization cycle of approximately several tens of times.

Note that as the temperature, pressure in the vaporizers 229$t$, 229$s$ (vaporizing chambers 20$t$, 20$s$), solvent (ECH) flow rate, and carrier gas flow rate in each of the vaporization cycle and the cleaning cycle of this embodiment, examples are shown as follows:

temperature in the vaporizer (vaporizing chamber): about 250° C.

pressure in the vaporizer (vaporizing chamber): several to 10 Torr (133 to 1330 Pa), solvent supply flow rate (first flow rate): 0.05 to 0.5 cc/min, carrier gas supply flow rate: 1 to 4 slm.

In addition, as the temperature, pressure in the vaporizers 229$t$, 229$s$ (vaporizing chambers 20$t$, 20$s$), solvent (ECH) flow rate, and carrier gas flow rate in the flushing cycle of this embodiment, examples are shown as follows:

temperature in the vaporizer (vaporizing chamber): about 250° C.

pressure in the vaporizer (vaporizing chamber): several to 10 Torr (133 TO 1330 Pa) or more solvent supply flow rate (second flow rate): 2 to 20 times the first flow rate, preferably 2 to 10 times the first flow rate.

the carrier gas supply flow rate: 1 to 10 slm.

Note that in the flushing cycle, since the flow rate of the solvent supplied to the vaporizers 229$t$, 229$s$ is increased, the pressures in the vaporizers 229$t$, 229$s$ become higher in the flushing cycle than in the vaporization cycle and the cleaning cycle.

According to this embodiment, by always flowing the solvent to the vaporizer, it is possible to suppress the blockage of the vaporizer, particularly the blockage of the spray mechanism part due to the source. In addition, by regularly performing the flushing operation to the vaporizer, the source can be effectively removed, the source being remained and deposited on the spray mechanism part, although the normal pipe cleaning cycle is executed. This makes it possible to further suppress the blockage of the spray mechanism part. By the aforementioned effect, the time taken for the blockage of the pipe can be greatly extended, thus making it possible to greatly reduce a non-operation time (down time) of the apparatus due to maintenance during the blockage of the vaporizer.

Note that in the substrate processing apparatus shown in FIG. 19, immediately after the vaporization cycle is ended, the source is sometimes remained in the liquid source flow passages 21$t$, 21$s$ of the vaporizers 229$t$, 229$s$. In such a case, when the flushing operation is performed immediately after the flushing cycle is started (immediately after the vaporization cycle is ended), the source remained in the liquid source flow passages 21$t$, 21$s$ is pushed away into the vaporizing chambers 20$t$, 20$s$ at once by the solvent at the second flow rate larger than the first flow rate, thus temporarily increasing the concentration of the source in the vaporizing chambers 20$t$, 20$s$. Then, the concentration of the source in the vaporizing chambers 20$t$, 20$s$ exceeds vaporization capability of the vaporizers 229$t$, 229$s$, thereby making it impossible to completely vaporize the source, and vaporization failure is generated in some cases.

Therefore, according to the present invention, when the solvent is flowed to the vaporizers 229$t$, 229$s$, at the second flow rate (when the flushing cycle is executed at the film deposition cycle (4)), the solvent is flowed to the vaporizers 229t, 229s at the flow rate smaller than the second flow rate, and thereafter, the supply of the solvent may be started to the vaporizers 229t, 229s at the second flow rate. In this case, preferably after flowing the solvent corresponding to capacity of the pipe in the liquid source flow passages 21t, 21s extending at least from the open/close valves vt1, vs1 to the vaporizers 20t, 20s, to the vaporizers 220t, 229s, at the flow rate smaller than the second flow rate, the supply of the solvent is started to the vaporizers 229t, 229s at the second flow rate.

Figure 10:
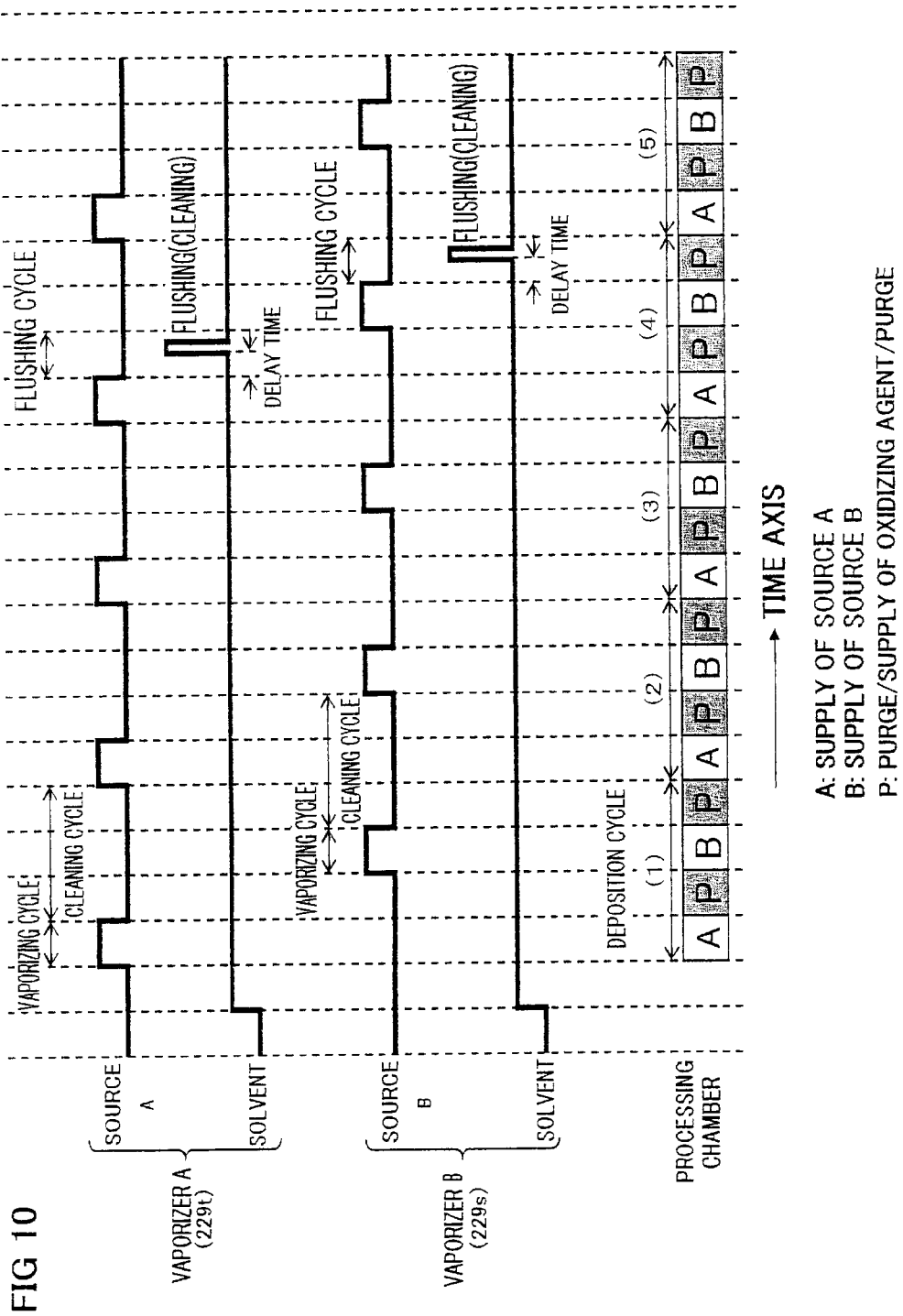
FIG. 10 shows a modified example of the sequence chart shown in FIG. 9, and shows the timing of supply of the solvent when start timing of the flushing operation is delayed.

FIG. 10 shows a modified example of the sequence chart shown in FIG. 9, showing the timing of supplying the solvent when a start timing of the flushing operation is delayed. According to FIG. 10, when the solvent is flowed to the vaporizers 229t, 229s, at the second flow rate, the solvent is flowed to the vaporizers 229t, 229s, at the first flow rate, and thereafter the flow rate of the solvent supplied to the vaporizers 229t, 229s is changed to the second flow rate from the first flow rate to start the flushing operation. Thus, immediately after the flushing cycle is started (immediately after the vaporization cycle is ended), the solvent is supplied into the vaporizing chambers 229t, 229s in the same way as the normal cleaning cycle, at the first flow rate, and the source remained in the liquid source flow passages 21t, 21s is pushed out into the vaporizing chambers 20t, 20s to be replaced by the solvent. Whereby, it is possible to suppress a state that the concentration of the source in the vaporizing chambers 20t, 20s exceeds the vaporization capability of the vaporizers 229t, 229s, thus making it possible to suppress the generation of the vaporization failure and suppress the blockage inside of the liquid source flow passages 21t, 21s.

A delayed time of the start timing of the flushing operation, namely, it is possible to calculate the time required from the start of the flushing cycle (end of the vaporization cycle) to start of the flushing operation, with a time required for flowing the solvent of a capacity corresponding to the capacity of the pipe in the liquid source flow passages 21t, 21s, for example, from the open/closed valves vt1, vs1 to the vaporizing chambers 20t, 20s, as a reference. In addition, in FIG. 10, the flow rate of the solvent supplied to the vaporizers 229t, 229s (the flow rate of the solvent supplied to the vaporizers 229t, 229s before the flushing operation is started) immediately after the flushing cycle is started (immediately after the vaporization cycle is ended) is not limited to the first flow rate, provided that this is the flow rate capable of slowing the increase in the concentration of the source in the vaporizers 20t, 20s, and suppressing the generation of the vaporization failure.

Figure 11:
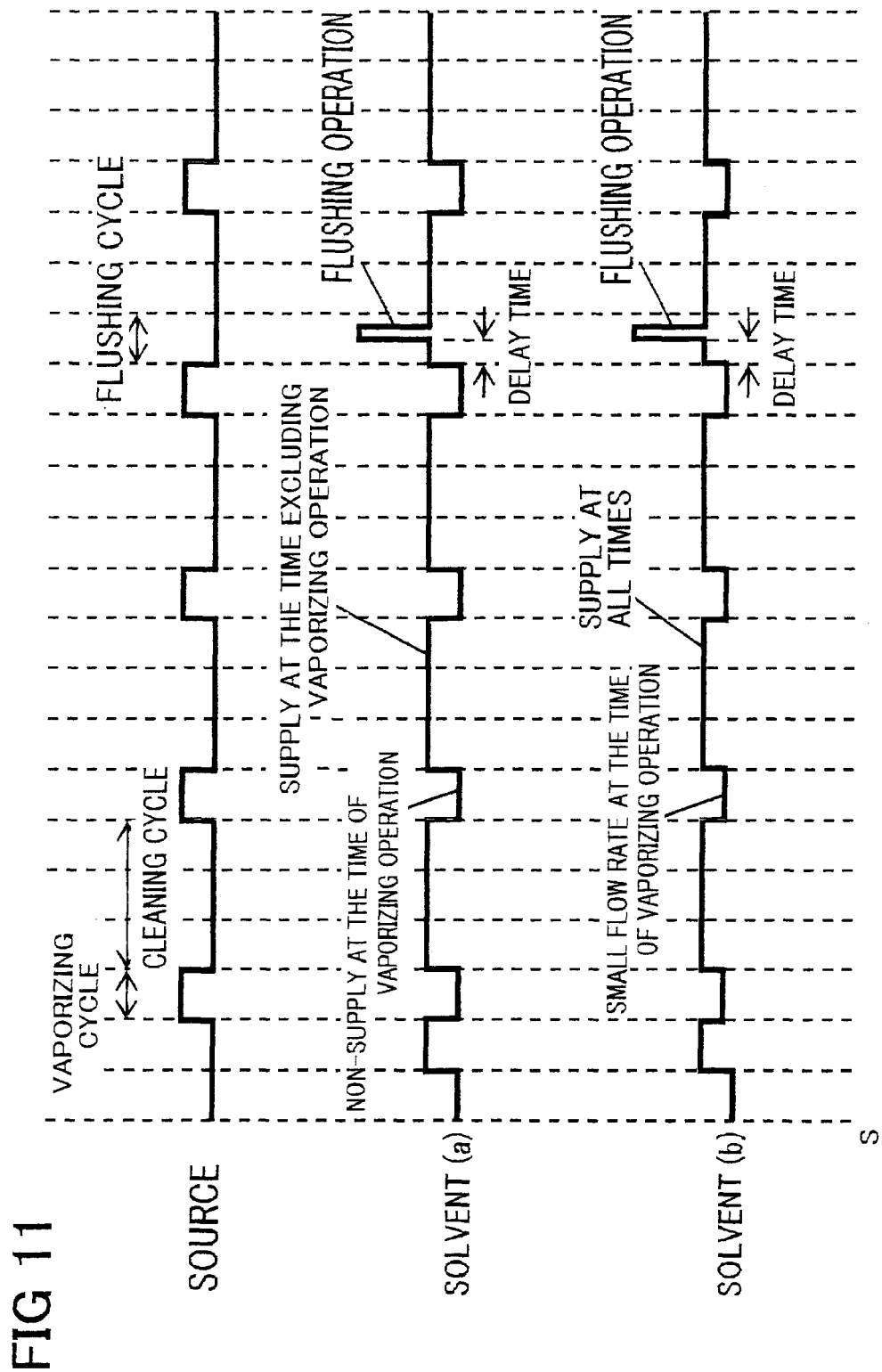
FIG. 11 is a modified example of the sequence chart shown in FIG. 10.

Note that according to the second embodiment, the solvent is always flowed into the vaporizing chambers 20t, 20s at the first flow rate, in the vaporization cycle and the normal cleaning cycle. However, the present invention is not limited thereto. Namely, the flushing cycle can be suitably executed, even in a case of not flowing the solvent into the vaporizing chambers 20t, 20s in the vaporization cycle, and in a case of flowing the solvent into the vaporizing chambers 20t, 20s in the vaporization cycle at the flow rate smaller than the first flow rate. FIG. 11 is a modified example of the sequence chart shown in FIG. 10, which is an excerpt of the timing of the vaporization cycle, the cleaning cycle, and the flushing cycle for one of the vaporizers 229t, 229s in FIG. 10. FIG. 11A shows the timing of supplying the solvent when the solvent is not flowed in each vaporization cycle, and FIG. 11B shows the timing of supplying the solvent when the flow rate of the solvent in the vaporization cycle is set smaller than the flow rate of the solvent in the cleaning cycle. In any case, as shown in FIG. 11, the start timing of the flushing operation can be delayed.

Figure 12:
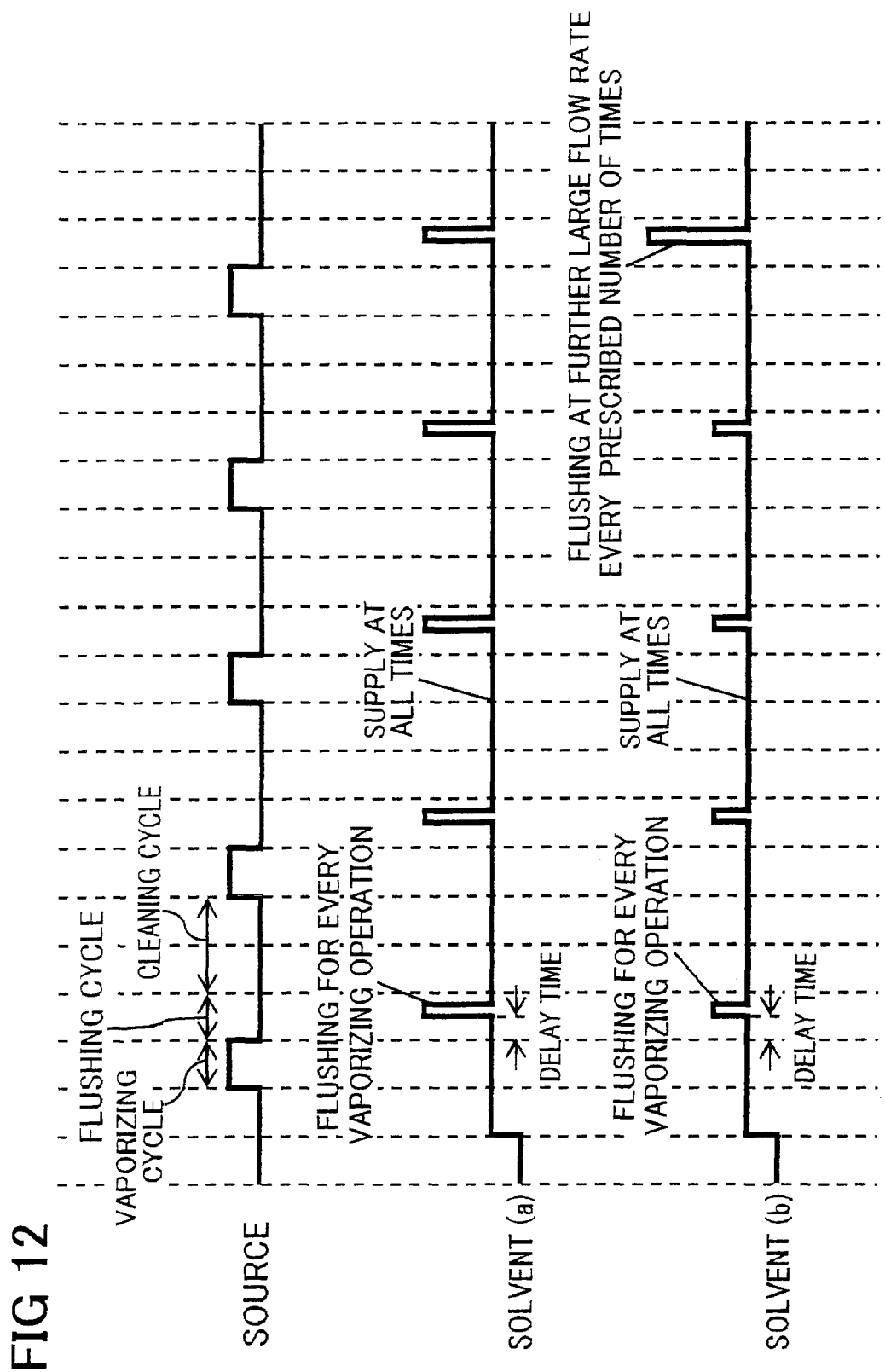
FIG. 12 shows a modified example of the sequence chart shown in FIG. 10.

In the second embodiment, the flushing cycle is executed every time the vaporization cycle is performed prescribed number of times. However, the present invention is not limited thereto. Namely, according to the present invention, the flushing cycle may be executed every time the vaporization cycle is performed. At this time, the flow rate of the solvent flowed in each flushing operation is not limited to a constant amount, and may be variable. For example, a large amount of flushing operation may be executed every time the vaporization cycle is performed, or a large amount of flushing operation may be executed every time the vaporization cycle is performed prescribed number of times, while executing a small amount of flushing operation every time the vaporization cycle is performed. FIG. 12 is a modified example of the sequence chart shown in FIG. 10, which is an excerpt of the timing of the vaporization cycle, the cleaning cycle, the flushing cycle for one of the vaporizers 229t, 229s in FIG. 10. FIG. 12A shows the timing of supplying the solvent when the large amount of flushing operation is executed every time the vaporization cycle is performed, and FIG. 12B shows the timing of supplying the solvent when the large amount of flushing operation is further executed every time the vaporization cycle is performed prescribed number of times, while executing the small amount of flushing operation every time the vaporization cycle is performed. In any case, as shown in FIG. 12, the start timing of the flushing operation can be delayed.

(Third Embodiment)

Next, a third embodiment of the present invention will be explained. The aforementioned first embodiment and the second embodiment describe an example of depositing a film by using a sheet feeding type ALD apparatus for processing one sheet of substrate at a time, as the substrate processing apparatus. However, the present invention is not limited thereto. For example, a batch type vertical ALD apparatus for processing a plurality of substrates at a time may be used to deposit the film. This vertical ALD apparatus will be explained hereunder.

FIG. 7 is a schematic block diagram of a vertical type processing furnace of the vertical ALD apparatus suitable used in the third embodiment, FIG. 7A shows a vertical sectional face of a processing furnace 302 part, and FIG. 7B shows the sectional face of the processing furnace 302 part taken along the line A-A.

As shown in FIG. 7A, the processing furnace 302 has a heater 307 as a heating unit (heating mechanism). The heater 307 is formed into a cylindrical shape, and is vertically installed by being supported by a heater base (not shown) as a holding plate.

A process tube 303 as a reaction tube is disposed concentrically with the heater 307, inside of the heater 307. The process tube 303 is composed of a heat-resistant material such as quartz ($SiO_2$) and silicon carbide (SiC), formed into the cylindrical shape with the upper end closed and the lower end opened. A processing chamber 301 is formed in a cylinder hollow part of the process tube 303, so as to contain wafers 200, being substrates, in a state of being vertically arranged in multiple stages in a horizontal posture by a boat 317 as will be described later.

A manifold 309 is disposed in a lower part of the process tube 303, concentrically with the process tube 303. The manifold 309 is composed of, for example, stainless, etc, and is formed into a cylindrical shape with the upper end and the lower end opened. The manifold 309 is engaged with the process tube 303, so as to support the process tube 303. Note that O-ring 320a as a seal member is provided between the manifold 309 and the process tube 303. The process tube 303 is set in a state of being vertically installed by supporting the manifold 309 by the heater base. A reaction vessel is formed by the process tube 303 and the manifold 309.

A first nozzle 333a as a first gas introduction part, and a second nozzle 333b as a second gas introduction part are connected to the manifold 309, so as to penetrate a side wall of the manifold 309 and partially communicate with the inside of the processing chamber 301. The first nozzle 333a and the second nozzle 333b of L-shape have horizontal parts and vertical parts respectively, with the horizontal parts connected to the manifold 309, and the vertical parts provided along a stacking direction of the wafers 200 on an inner wall of an upper part from a lower part of the reaction tube 303, in an arc-like space between the inner wall of the reaction tube 303 constituting the processing chamber 301 and the wafers 200. First gas supply holes 348a and second gas supply holes 348b, being supply holes for supplying gas, are respectively provided on the side faces of the vertical parts of the first nozzle 333a and the second nozzle 333b. These first gas supply holes 348a and the second gas supply holes 348b have the same opening areas extending from the lower part to the upper part, and further provided at the same opening pitch.

The gas supply system connected to the first nozzle 333a and the second nozzle 333b is the same as the aforementioned embodiment. However, according to this embodiment, the source gas supply pipe 213 is connected to the first nozzle 333a, and the ozone gas supply pipe 213o is connected to the second nozzle 333b, and this point is different from the aforementioned embodiment. Namely, according to this embodiment, the source gas (the first source gas, the second source gas, and the third source gas) and the ozone gas are supplied by different nozzles. Also, each source gas may be supplied by different nozzles.

An exhaust pipe 331 for exhausting atmosphere in the processing chamber 301 is provided in the manifold 309. A vacuum pump 346, being a vacuum exhaust device, is connected to the lower stream side, being the opposite side to the connection side to the manifold 309 of the exhaust pipe 331, via a pressure sensor 345, being a pressure detector, and an APC (Auto Pressure Controller) valve 342, being a pressure adjuster, so that the pressure in the processing chamber 301 is set to a prescribed pressure (degree of vacuum). Note that by opening/closing the valve of the APC valve 342, it is possible to perform vacuum-exhaust/stop of vacuum-exhaust of the inside of the processing chamber 301, and further by adjusting the opening degree of the valve, the pressure in the processing chamber 301 can be adjusted.

A seal cap 319 as a lid member of a furnace port capable of air-tightly closing the lower end opening of the manifold 309 is provided in the lower part of the manifold 309. The seal cap 319 is abutted on the lower end of the manifold 309 from the lower side in a vertical direction. The seal cap 319 is composed of metal such as stainless, and is formed into a disc shape. O-ring 320b, being the seal member abutted on the lower end of the manifold 309, is provided on the upper surface of the seal cap 319. A rotation mechanism 367 for rotating the boat 317 as will be described later is installed on the opposite side to the processing chamber 301 across the seal cap 319. A rotary axis 355 of the rotation mechanism 367 is passed through the seal cap 319 and is connected to the boat 317, and by rotating the boat 317, each wafer 200 is rotated. The seal cap 319 is vertically elevated by a boat elevator 315, being an elevation mechanism, disposed vertically outside of the process tube 303, thus making it possible to load/unload the boat 317 into/from the processing chamber 301.

The boat 317, being a substrate holding tool, is composed of a heat-resistant material such as quartz or silicon carbide, and is constituted to hold a plurality of wafers 200 so as to be arranged in a horizontal posture, with centers thereof mutually aligned with one another, in multiple stages. Note that a heat-resistant member 318 composed of the heat-resistant material such as quartz or silicon carbide, is provided in the lower part of the boat 317, so that heat from the heater 307 is hardly transmitted to the side of the seal cap 319. Note that the heat-resistant member 318 may also be constituted of a plurality of heat-insulating plates composed of the heat-resistant material such as quartz or silicon carbide, and a heat insulating plate holder for holding these heat-insulating plates in a horizontal posture in multiple stages. A temperature sensor 363 as a temperature detector is installed in the process tube 303, and by adjusting a power supply condition to the heater 307 based on temperature information detected by the temperature sensor 363, the temperature in the processing chamber 301 is set to have a prescribed temperature distribution. In the same way as the first nozzle 333a and the second nozzle 333b, the temperature sensor 363 is provided along the inner wall of the process tube 303.

The controller 380, being a controller (control unit), controls the operations of the APC valve 342, the heater 307, the temperature sensor 363, the vacuum pump 346, the boat rotation mechanism 367, the boat elevator 315, the open/close valves vs1 to vs6, vb1 to vb6, vt1 to vt6, vo3 to vo6, the liquid flow controllers 221s, 221b, 221t, 222s, 222b, 222t, the flow controllers 224s, 224b, 224t, 221o, 222o, 224o, etc.

Next, explanation will be given for the substrate processing step of forming the thin film on the wafer 200 by the ALD method, as one step of the manufacturing steps of the semiconductor device, by using the processing furnace 302 of the vertical ALD apparatus having the aforementioned structure. Note that in the explanation given hereunder, the operation of each part constituting the vertical ALD apparatus is controlled by the controller 380.

A plurality of wafers 200 are charged into the boat 317 (wafer charge). Then, as shown in FIG. 7A, the boat 317 holding the plurality of wafers 200 is lifted by the boat elevator 315, and is loaded into the processing chamber 301 (boat load). In this state, the lower end of the manifold 309 is sealed by the seal cap 319, via the O-ring 320b.

The inside of the processing chamber 301 is vacuum-exhausted by the vacuum exhaust device 346 so as to be set to a desired pressure (degree of vacuum). At this time, the pressure of the inside of the processing chamber 301 is measured by the pressure sensor 345 and based on the pressure thus measured, the pressure adjuster 342 is feed-back controlled. In addition, the inside of the processing chamber 301 is heated by the heater 307 so as to be set to a desired temperature. At this time, the power supply condition to the heater 307 is feedback-controlled based on the temperature information detected by the temperature sensor 363, so as to have a desired temperature distribution inside of the processing chamber 301. Subsequently, each wafer 200 is rotated by rotating the boat 317 by the rotation mechanism 367.

Thereafter, in the same way as the aforementioned first embodiment, the ALD step using the first source gas (S6), the ALD step using the third source gas (S7), the ALD step using the second source gas (S8), the ALD step using the third source gas (S9) are set as one cycle, and by repeating this cycle prescribed number of times (S10), the $TiO_3$ thin film containing (Ba, Sr) of a desired thickness is formed on the wafer 200. Alternately, in the same way as the aforementioned second embodiment, supply of the source A (A), purge, supply of the oxidizing agent, purge (P), supply of the source B (B), purge, supply of the oxidizing agent, purge (P) are set as one cycle, and by repeating this cycle prescribed number of times, SrTiO$_3$ thin film of a desired thickness is formed on the wafer 200.

Thereafter, the seal cap 319 is also lowered by the boat elevator 315, and the lower end of the manifold 309 is opened, and the wafer 200 after being formed with the thin film of a desired thickness is unloaded to outside of the process tube 303 from the lower end of the manifold 309 in a state of being held by the boat 317. Then, the processed wafer 200 is taken out from the boat 317 (wafer discharge).

<Preferred Aspects of the Present Invention>

Preferred aspects of the present invention will be additionally described hereunder.

A first aspect of the present invention provides a method of manufacturing a semiconductor device, including the steps of:

loading a substrate into a processing chamber;

processing the substrate by supplying a plurality of kinds of reaction substances into the processing chamber multiple number of times; and unloading the processed substrate from the processing chamber, wherein at least any one of the plurality of kinds of reaction substances contains a source gas obtained by vaporizing a liquid source by a vaporizer, vaporizing operation of supplying the liquid source to the vaporizing part and vaporizing the liquid source is intermittently performed in the step of processing the substrate, the solvent capable of dissolving the liquid source is flowed to the vaporizing part at a first flow rate, at least at a time other than performing the vaporizing operation of the liquid source, and the solvent is flowed to the vaporizing part at a second flow rate larger than the first flow rate, at a time other than performing the vaporizing operation of the liquid source and every time performing the vaporizing operation of the liquid source prescribed number of times.

Preferably, in the step of processing the substrate, the solvent is continuously flowed to the vaporizing part, after a first vaporizing operation of the liquid source until the next vaporizing operation of the liquid source is performed.

Also preferably, in the step of processing the substrate, irrespective of the vaporizing operation of the liquid source, the solvent is continuously flowed to the vaporizing part.

Also preferably, the solvent flowed to the vaporizing part is exhausted without being supplied into the processing chamber at a time other than performing the vaporizing operation of the liquid source.

Also preferably, the second flow rate is twice or more the first flow rate.

Also preferably, when the solvent is flowed to the vaporizing part at the second flow rate, the solvent is flowed to the vaporizing part once at the first flow rate and the flow rate of the solvent supplied to the vaporizing part is changed to the second flow rate from the first flow rate.

Also preferably, when the solvent is flowed to the vaporizing part at the second flow rate, the solvent is flowed to the vaporizing part once at the flow rate smaller than the second flow rate, and thereafter supply of the solvent to the vaporizing part at the second flow rate is started.

Another aspect of the present invention provides a substrate processing apparatus, comprising:

a processing chamber that processes a substrate;

a vaporizing part that vaporizes a liquid source a liquid source supply system that supplies the liquid source to the vaporizing part;

a source gas supply system that supplies a source gas into the processing chamber, the source gas being obtained by vaporizing the liquid source by the vaporizing part;

a reaction gas supply system that supplies reaction gas different from the source gas into the processing chamber;

a solvent supply system that supplies a solvent capable of dissolving the liquid source to the vaporizing part; and a controller that controls the liquid source supply system, the vaporizing part, the source gas supply system, the solvent supply system, and the reaction gas supply system, so that supply of the liquid source and supply of the reaction gas into the processing chamber are performed multiple number of times, and at this time, vaporizing operation of supplying the liquid source to the vaporizing part to be vaporized is performed intermittently, and at a time other than performing the vaporizing operation of the liquid source, the solvent is flowed to the vaporizing part at a first flow rate, and at time other than performing the vaporizing operation of the liquid source and every time performing the vaporizing operation of the liquid source prescribed number of times, the solvent is flowed to the vaporizing part at a second flow rate larger than the first flow rate.

Further another aspect of the present invention provides a method of manufacturing the semiconductor device having the step of processing the substrate by supplying a plurality of kinds of reaction substances into the processing chamber containing the substrate multiple number of times, wherein at least any one of the plurality of kinds of reaction substances contains the source gas obtained by vaporizing a liquid source by a vaporizing part, the liquid source is intermittently supplied to the vaporizing part to be vaporized in the step of processing the substrate, a solvent capable of dissolving the liquid source is continuously supplied and vaporized, and at a time other than supplying the liquid source to the vaporizing part and every time the supply of the liquid source is performed prescribed number of times, flushing operation is performed for flowing the solvent to the vaporizing part at a flow rate larger than the flow rate of the solvent supplied at a time of supplying the liquid source.

Further another aspect of the present invention provides a substrate processing apparatus including the steps of:

a processing chamber that processes a substrate;

a vaporizing part that vaporizes a liquid source;

a liquid source supply part that supplies the liquid source to the vaporizing part;

a source gas supply pipe that supplies source gas into the processing chamber, the source gas being obtained by vaporizing the liquid source by the vaporizing part;

a reaction gas supply pipe that supplies reaction gas into the processing chamber, the reaction gas being different from the source gas;

a solvent supply pipe that supplies a solvent to the vaporizing part, the solvent being capable of dissolving the liquid source; and a controller that performs control, so that the substrate is processed by performing supply of the source gas and supply of the reaction gas into the processing chamber multiple number of times, and at this time, the liquid source is intermittently supplied to the vaporizing part to be vaporized, then the solvent is continuously supplied and vaporized, and at a time other than supplying the liquid source to the vaporizing part and every time performing supply of the liquid source prescribed number of times, flushing operation is performed for flowing the solvent to the vaporizing part at a flow rate larger than the flow rate of the solvent supplied at the time of supplying the liquid source.

Further another aspect of the present invention provides an operation method of a vaporizer for mixing and supplying a liquid source and a solvent capable of dissolving a source by a vaporizer of the liquid source used in a semiconductor manufacturing device, having a spray mechanism inside, or supplying them in another system and mixing them inside of the vaporizer, wherein supply of a source is intermittently performed according to a need on the side of the semiconductor manufacturing device, and meanwhile irrespective of a supply cycle of the source, the solvent is continuously supplied and vaporized to thereby suppress a blockage of a spray mechanism part due to the source and a decomposed substance of this source remained in the vicinity of the spray mechanism.

Here, when the source is a solid source or a liquefied source obtained by dissolving and liquefying the liquid source in the solvent having high viscosity, the solvent is included in the source itself, and therefore by supplying/vaporizing the solvent only in a cycle in which no liquefied source is supplied, other than continuously supplying/vaporizing the solvent, irrespective of the supply/vaporization cycle of the source, it is possible to suppress the blockage of the spray mechanism part due to the source and the decomposed substance of this source remained in the vicinity of the spray mechanism.

Preferably, in the cycle of flowing only the solvent, the solvent of at least twice the flow rate of the solvent in the source vaporization cycle is flowed to change a flowing speed and pressure in the vicinity of the vaporization nozzle, and the flushing operation is effectively performed for cleaning the source remained in the vicinity of the nozzle. Further preferably, by flowing the purge gas such as nitrogen in a mixed state with the solvent, the cleaning effect is improved. Further preferably, the flushing cleaning operation is executed, for every vaporization cycle of the source or every time the source vaporization cycle is repeated several times in a range not blocking the spray mechanical part.

Further another aspect of the present invention provides a method of manufacturing a semiconductor device having the step of processing a substrate by supplying plural kinds of reaction substances into a processing chamber in which the substrate is stored, multiple number of times, wherein at least any one of the plural kinds of reaction substances contains the source gas obtained by vaporizing the liquid source by the vaporizer, and the vaporizer is cleaned by the cleaning liquid before the liquid source is vaporized by the vaporizer after at least a single supply operation of the source gas obtained by vaporizing by the vaporizer is performed into the processing chamber.

Preferably, cleaning of the vaporizer is performed every single supply operation of the source gas. Also, preferably, the liquid source is diluted by the solvent, and the cleaning liquid is the solvent for diluting the liquid source. Also preferably, the solvent is ethylcyclohexane or tetrahydrofuran. Also preferably, when the vaporizing part is cleaned, the cleaning liquid is vaporized by the vaporizing part, and the vaporized cleaning liquid is exhausted to the outside of the processing chamber. Also preferably, the liquid source contains at least any one of Sr, Ba, Ti. Also preferably, the liquid source contains Sr liquid source, Ba liquid source, and Ti liquid source.

Further another aspect of the present invention provides a substrate processing apparatus including the steps of:
a processing chamber that processes a substrate;
a vaporizing part that vaporizes a liquid source;
a liquid source supply pipe that supplies the liquid source to the vaporizing part;
a source gas supply pipe that supplies the source gas into the processing chamber, the source gas being obtained by vaporizing the liquid source by the vaporizing part;
a leaning liquid supply pipe that supplies cleaning liquid to the vaporizing part; and
a controller that performs control, to process the substrate by performing supply of the source gas into the processing chamber and supply of the reaction substance into the processing chamber multiple number of times, and performs control to clean the vaporizing part by supplying the cleaning liquid to the vaporizing part before the liquid source is vaporized next by the vaporizing part after at least a single supply operation of the source gas is performed.

Preferably, the controller performs control to perform cleaning of the vaporizer for every single supply operation of the source gas. Also preferably the liquid source is diluted by the solvent, and the cleaning liquid is the solvent for diluting the liquid source. Also preferably the solvent is ethylcyclohexane or tetrahydrofuran. Also preferably, the controller performs control so that when cleaning the vaporizing part, the cleaning liquid is vaporized by the vaporizing part and the vaporized cleaning liquid is exhausted to outside of the processing chamber. Also preferably, the liquid source contains at least any one of Sr, Ba, Ti. Also preferably the liquid source contains Sr liquid source, Ba liquid source, and Ti liquid source.

Further another aspect of the present invention provides a method of manufacturing a semiconductor device, having the step of processing substrate, with the step of supplying one reaction substance onto substrate and the step of supplying the other reaction substance onto the substrate set as one cycle, and by repeating this cycle multiple number of times, wherein a at least any one of the reaction substances contains the source gas obtained by vaporizing the liquid source by the vaporizing part, and the vaporizing part is cleaned by other liquid after at least a single supply operation of the liquid source is performed to the vaporizing part.

Further another aspect of the present invention provides a substrate processing apparatus, including the steps of:
a processing chamber that processes a substrate;
a vaporizing part that vaporizes a liquid source;
a liquid source supply pipe that supplies the liquid source to the vaporizing part;
a source gas supply pipe that supplies source gas into the processing chamber, the source gas being obtained by vaporizing the liquid source by the vaporizing part;
a reaction substancesupply pipe that supplies the reaction substance into the processing chamber, the reaction substance being different from the source gas;
a cleaning liquid supply pipe that supplies cleaning liquid to the vaporizing part; and
a controller that performs control to process the substrate by performing supply of the source gas and supply of the reaction substance into the processing chamber multiple number of times, and also performs control to clean the vaporizing part by supplying the cleaning liquid to the vaporizing part after at least a single supply operation of the liquid source is performed to the vaporizing part.

Further another aspect of the present invention provides a method of manufacturing a semiconductor device, with the step of supplying a source gas into a processing chamber in which the substrate is stored, the source gas being obtained by vaporizing a liquid source by a vaporizing part, and the step of supplying an oxidizing agent into the processing chamber set as one cycle, for processing the substrate by repeating this cycle multiple number of times, wherein the vaporizing part is cleaned by cleaning liquid after at least a single supply operation of the source gas vaporized by the vaporizing part is performed into the processing chamber, and before the liquid source is vaporized next by the vaporizing part.

Further another aspect of the present invention provides a method of manufacturing a semiconductor device, with the step of supplying plural kinds of source gases into the processing chamber in which the substrate is stored, each source gas obtained by separately vaporizing plural kinds of liquid sources by each different vaporizing part, and the step of supplying an oxidizing agent into the processing chamber, set as one cycle, for processing the substrate by repeating this cycle multiple number of times, wherein the aforementioned each vaporizing part is cleaned by cleaning liquid after at least a single supply operation of the aforementioned each source gas into the processing chamber and before the aforementioned each liquid source is vaporized next by each of the vaporizing parts.

What is claimed is:

1. A method of manufacturing a semiconductor device, comprising:
   containing a substrate into a processing chamber; and
   processing the substrate by supplying a plurality of reaction substances into the processing chamber, wherein
   at least one of the plurality of reaction substances contains a source gas obtained by vaporizing a liquid source by a vaporizing part,
   in processing the substrate, a solvent capable of dissolving the liquid source is continuously flowed to the vaporizing part, and a vaporizing operation, in which the liquid source is supplied to the vaporizing part and the liquid source is vaporized, is intermittently performed, and
   at a time other than a time of performing the vaporizing operation and every time the vaporizing operation is performed a prescribed number of times, a flushing operation, in which the solvent is flowed to the vaporizing part at a flow rate larger than a flow rate of the solvent flowed at the time of the vaporizing operation, is performed.

2. The method according to claim 1, wherein the flow rate of the solvent flowed to the vaporizing part at the time of the flushing operation is at least twice the flow rate of the solvent flowed to the vaporizing part at the time of the vaporizing operation.

3. The method according to claim 1, wherein the flow rate of the solvent flowed to the vaporizing part at the time of the flushing operation is twice to twenty times the flow rate of the solvent flowed to the vaporizing part at the time of the vaporizing operation.

4. The method according to claim 1, wherein the solvent flowed to the vaporizing part at the time of the flushing operation is exhausted without being supplied into the processing chamber.

5. The method according to claim 1, wherein at the time other than performing the vaporizing operation, the solvent flowed to the vaporizing part is exhausted without being supplied into the processing chamber.

6. The method according to claim 1, wherein at the time of the flushing operation when the solvent is flowed to the vaporizing part at the large flow rate, the solvent is flowed to the vaporizing part once at a flow rate of the solvent flowed at operation, and thereafter a flow rate the time of the vaporizing operation, and thereafter a flow rate of the solvent flowed to the vaporizing part is changed to the large flow rate.

7. The method according to claim 1, wherein at the time of the flushing operation when the solvent is flowed to the vaporizing part at the large flow rate, the solvent is flowed to the vaporizing part once at a flow rate smaller than the large flow rate, and thereafter a flow rate of the solvent flowed to the vaporizing part is changed to the large flow rate.

8. The method according to claim 1, wherein at the time of the flushing operation when the solvent is flowed to the vaporizing part at the large flow rate, the solvent is flowed to the vaporizing part once at a flow rate smaller than the large flow rate, and thereafter supply of the solvent to the vaporizing part at the large flow rate is started.

9. The method according to claim 1, wherein, in processing the substrate, the plurality of reaction substances are intermittently supplied into the processing chamber.

10. The method according to claim 1, wherein, in processing the substrate, the plurality of reaction substances are intermittently alternately supplied into the processing chamber.

11. The method according to claim 1, wherein, in processing the substrate, the source gas is intermittently supplied into the processing chamber.

12. The method according to claim 1, wherein, at least one of the plurality of reaction substances contains a reaction gas being different from the source gas, and
   in processing the substrate, the source gas and the reaction gas are alternately supplied into the processing chamber.

13. A method of processing a substrate, comprising:
   containing a substrate into a processing chamber; and
   processing the substrate by supplying a plurality of reaction substances into the processing chamber, wherein
   at least one of the plurality of reaction substances contains a source gas obtained by vaporizing a liquid source by a vaporizing part,
   in processing the substrate, a solvent capable of dissolving the liquid source is continuously flowed to the vaporizing part, and a vaporizing operation, in which the liquid source is supplied to the vaporizing part and the liquid source is vaporized, is intermittently performed, and
   at a time other than a time of performing the vaporizing operation and every time the vaporizing operation is performed a prescribed number of times, a flushing operation, in which the solvent is flowed to the vaporizing part at a flow rate larger than a flow rate of the solvent flowed at the time of the vaporizing operation, is performed.

14. A substrate processing apparatus, comprising:
   a processing chamber in which a substrate is processed;
   a vaporizing part that vaporizes a liquid source;
   a liquid source supply system that supplies the liquid source to the vaporizing part;
   a source gas supply system that supplies a source gas into the processing chamber, the source gas obtained by vaporizing the liquid source by the vaporizing part;
   a reaction gas supply system that supplies a reaction gas different from the source gas into the processing chamber;
   a solvent supply system that supplies a solvent capable of dissolving the liquid source to the vaporizing part; and
   a controller that is configured to control the liquid source supply system, the vaporizing part, the source gas supply system, the solvent supply system, and the reaction gas supply system, so that the substrate is processed by supplying the source gas and the reaction gas into the processing chamber containing the substrate, and at this time, the solvent is continuously flowed to the vaporizing part, and a vaporizing operation, in which the liquid source is supplied to the vaporizing part and the liquid source is vaporized, is performed intermittently, and at a time other than a time of performing the vaporizing operation and every time the vaporizing operation is performed a prescribed number of times, a flushing operation, in which the solvent is flowed to the vaporizing part at a flow rate larger than a flow rate of the solvent flowed at the time of the vaporizing operation, is performed.

* * * * *